(12) United States Patent
Yang et al.

(10) Patent No.: US 12,402,314 B2
(45) Date of Patent: *Aug. 26, 2025

(54) THREE-DIMENSIONAL SEMICONDUCTOR MEMORY DEVICES

(71) Applicant: Samsung Electronics Co., Ltd., Suwon-si (KR)

(72) Inventors: Jaehyun Yang, Suwon-si (KR); Bio Kim, Seoul (KR); Yujin Kim, Suwon-si (KR); Kyong-Won An, Seoul (KR); Sookyeom Yong, Hwaseong-si (KR); Junggeun Jee, Siheung-si (KR); Youngjun Cheon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 321 days.

This patent is subject to a terminal disclaimer.

(21) Appl. No.: 18/161,331

(22) Filed: Jan. 30, 2023

(65) Prior Publication Data
US 2023/0180477 A1 Jun. 8, 2023

Related U.S. Application Data

(63) Continuation of application No. 17/005,495, filed on Aug. 28, 2020, now Pat. No. 11,569,261, which is a
(Continued)

(30) Foreign Application Priority Data

Sep. 19, 2018 (KR) .................. 10-2018-0112265

(51) Int. Cl.
*H10B 43/27* (2023.01)
*H10B 41/27* (2023.01)
(Continued)

(52) U.S. Cl.
CPC ............ *H10B 43/27* (2023.02); *H10B 41/27* (2023.02); *H10B 41/35* (2023.02); *H10B 43/35* (2023.02)

(58) Field of Classification Search
CPC ...................................................... H10B 43/27
See application file for complete search history.

(56) References Cited

U.S. PATENT DOCUMENTS 8,482,049 B2 7/2013 Son et al.
8,741,761 B2 6/2014 Lee et al.
(Continued)

FOREIGN PATENT DOCUMENTS

CN 102122661 A 7/2011
CN 106558591 A 4/2017
(Continued)

*Primary Examiner* — Christopher A Johnson
(74) *Attorney, Agent, or Firm* — Harness, Dickey & Pierce, P.L.C.

(57) ABSTRACT

A three-dimensional semiconductor memory device is provided. The device may include a first stack structure on a substrate including a cell array region and a connection region, a second stack structure on the first stack structure, a first vertical channel hole penetrating the first stack structure and partially exposing the substrate and a bottom surface of the second stack structure, on the cell array region, a second vertical channel hole penetrating the second stack structure and exposing the first vertical channel hole, on the cell array region, a bottom diameter of the second vertical channel hole being smaller than an top diameter of the first vertical channel hole, and a buffer pattern placed in the first vertical channel hole and adjacent to the bottom surface of the second stack structure.

20 Claims, 26 Drawing Sheets

Related U.S. Application Data continuation of application No. 16/379,063, filed on Apr. 9, 2019, now Pat. No. 10,797,074.

(51) Int. Cl.
*H10B 41/35* (2023.01)
*H10B 43/35* (2023.01)

(56) References Cited

U.S. PATENT DOCUMENTS

| | | | |
|---|---|---|---|
| 9,570,463 | B1 | 2/2017 | Zhang et al. |
| 9,691,783 | B2 | 6/2017 | Yoon |
| 9,698,153 | B2 | 7/2017 | Liu et al. |
| 9,698,233 | B2 | 7/2017 | Choi et al. |
| 9,780,034 | B1 | 10/2017 | Tsutsumi et al. |
| 9,853,043 | B2 | 12/2017 | Lu et al. |
| 9,871,052 | B2 | 1/2018 | Lee |
| 10,050,056 | B2 | 8/2018 | Park et al. |
| 10,096,616 | B2 | 10/2018 | Lee et al. |
| 10,790,294 | B2 | 9/2020 | Shim et al. |
| 11,569,261 | B2 * | 1/2023 | Yang .................... H10B 43/10 |
| 2016/0005760 | A1 | 1/2016 | Lee et al. |
| 2017/0110473 | A1 | 4/2017 | Lee |
| 2017/0207232 | A1 | 7/2017 | You et al. |
| 2017/0236835 | A1 | 8/2017 | Nakamura et al. |
| 2017/0271261 | A1 * | 9/2017 | Tsutsumi .............. H10B 43/27 |
| 2017/0345727 | A1 | 11/2017 | Takakuwa |
| 2017/0345843 | A1 | 11/2017 | Lee et al. |

FOREIGN PATENT DOCUMENTS

| | | |
|---|---|---|
| CN | 107346771 A | 11/2017 |
| CN | 108022929 A | 5/2018 |
| CN | 108093656 A | 5/2018 |
| KR | 2013-0005434 A | 1/2013 |
| KR | 2015-0113634 A | 10/2015 |
| KR | 2017-0044418 A | 4/2017 |

* cited by examiner

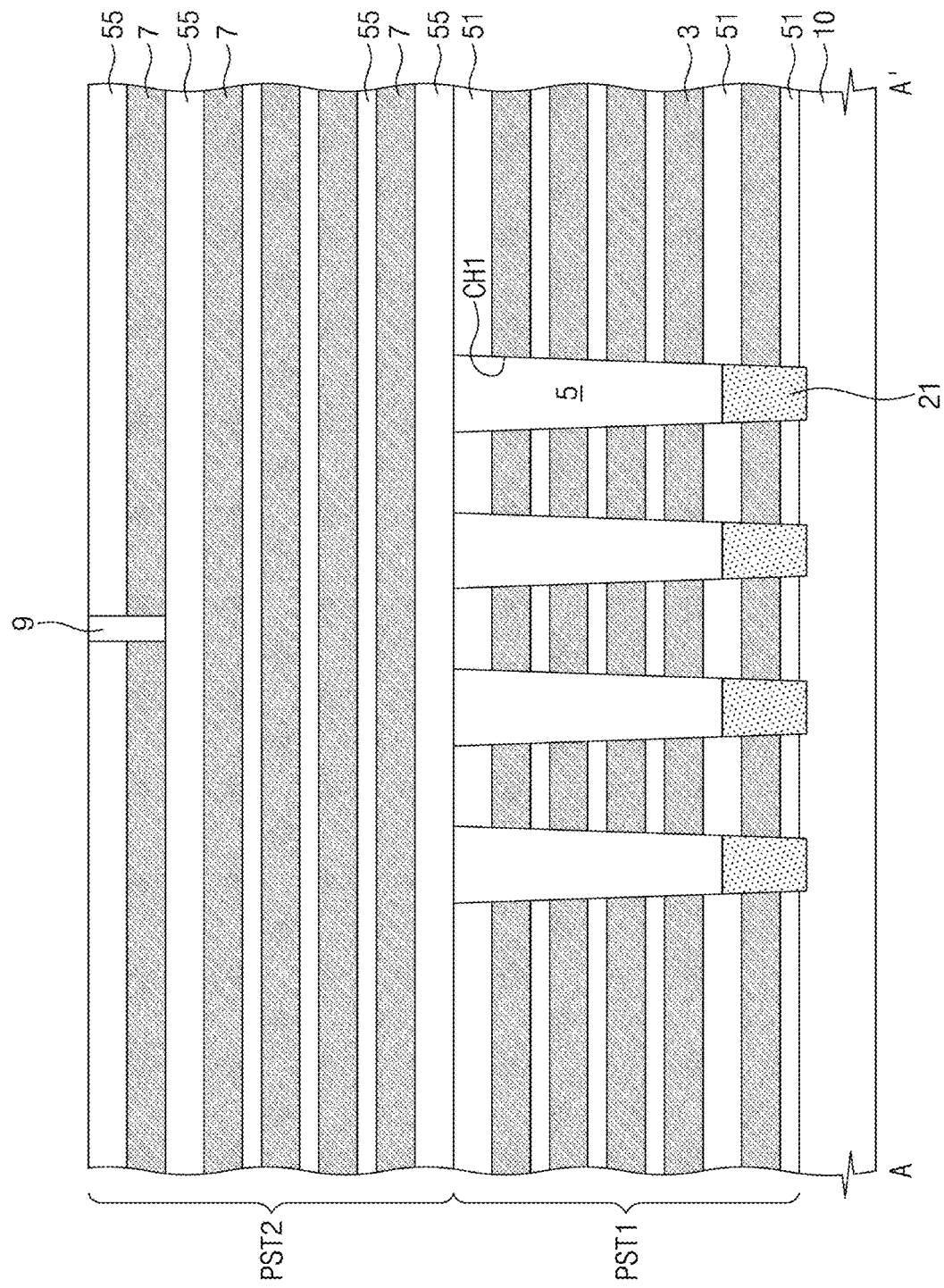

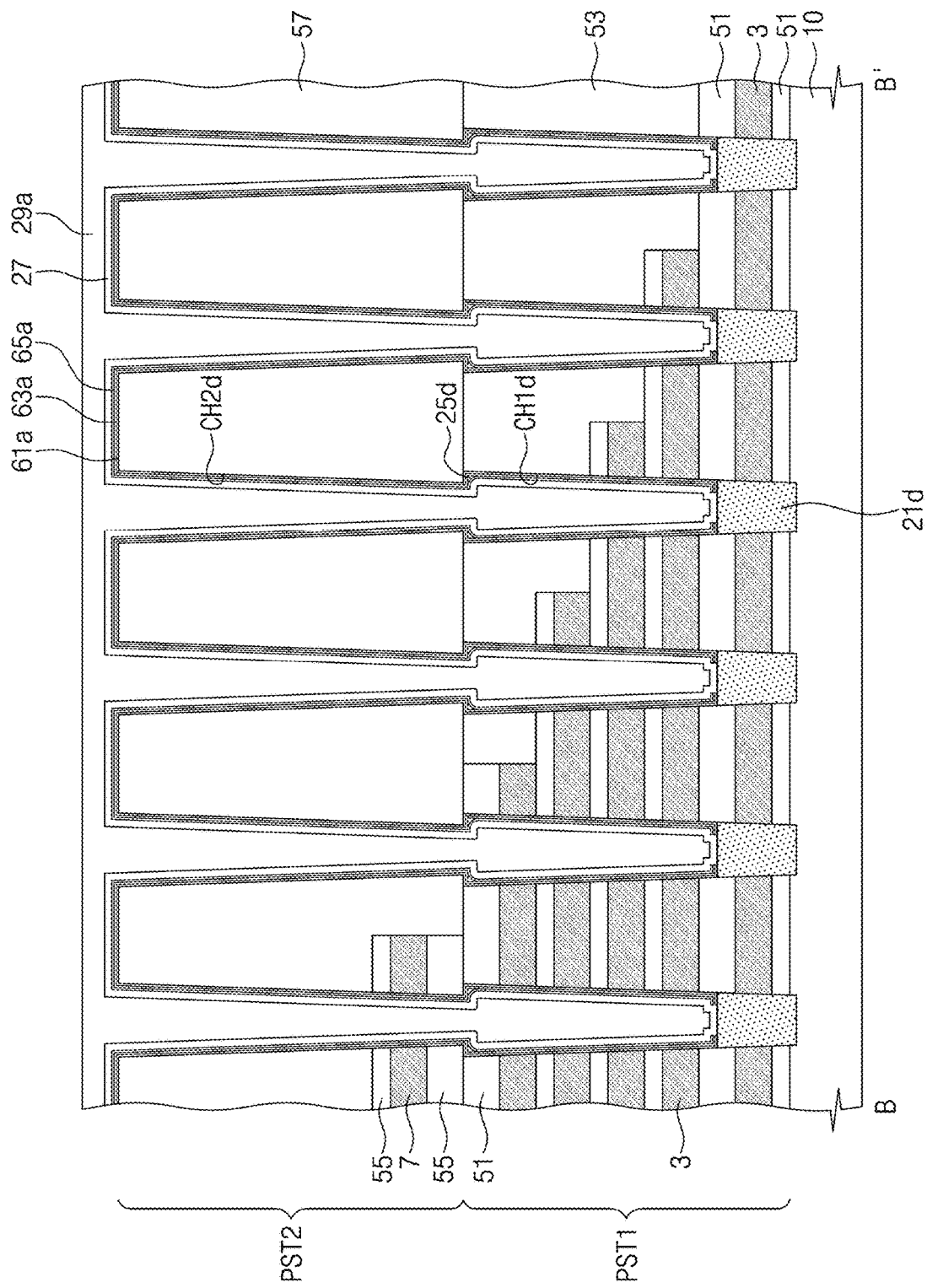

THREE-DIMENSIONAL SEMICONDUCTOR MEMORY DEVICES

CROSS-REFERENCE TO RELATED APPLICATIONS

This is a continuation of U.S. patent application Ser. No. 17/005,495, filed on Aug. 28, 2020, which is a continuation of U.S. patent application Ser. No. 16/379,063, filed on Apr. 9, 2019, which claims priority under 35 U.S.C. § 119 to Korean Patent Application No. 10-2018-0112265, filed on Sep. 19, 2018, in the Korean Intellectual Property Office, the disclosures of each of which are hereby incorporated by reference in their entirety.

BACKGROUND

The present disclosure relates to a three-dimensional semiconductor memory device, and in particular, to a highly reliable three-dimensional semiconductor memory device.

Upgraded integration of semiconductor devices is required to satisfy consumer demands for improved performance and/or inexpensive prices. In the case of semiconductor devices, since their integration is a factor in determining product prices, increased integration is desirable. In the case of two-dimensional or planar semiconductor devices, since their integration is determined by the area occupied by a unit memory cell, integration is influenced by the level of a fine pattern forming technology. However, expensive process equipment is needed to increase pattern fineness sets, presenting a practical limitation on increasing integration for two-dimensional or planar semiconductor devices. To overcome such a limitation, three-dimensional semiconductor memory devices, including three-dimensionally arranged memory cells, have been proposed.

SUMMARY

Some example embodiments of the inventive concepts provide a highly reliable three-dimensional semiconductor memory device.

According to some example embodiments of the inventive concepts, a three-dimensional semiconductor memory device may include a first stack structure on a substrate including a cell array region and a connection region, a second stack structure on the first stack structure, a first vertical channel hole penetrating the first stack structure and partially exposing the substrate and a bottom surface of the second stack structure, on the cell array region, a second vertical channel hole penetrating the second stack structure and exposing the first vertical channel hole, on the cell array region, a bottom diameter of the second vertical channel hole being smaller than a top diameter of the first vertical channel hole, and a buffer pattern placed in the first vertical channel hole and adjacent to the bottom surface of the second stack structure. An upper portion of an inner side surface of the first vertical channel hole may include a first position and a second position, which are spaced apart from each other and are located at a same level, and a width of the buffer pattern on the first position may be different from a width of the buffer pattern on the second position.

According to some example embodiments of the inventive concepts, a three-dimensional semiconductor memory device may include a first stack structure on a substrate, a second stack structure on the first stack structure, a first vertical channel hole penetrating the first stack structure and partially exposing the substrate and a bottom surface of the second stack structure, a second vertical channel hole penetrating the second stack structure and exposing the first vertical channel hole, a bottom diameter of the second vertical channel hole being smaller than a top diameter of the first vertical channel hole, and a buffer pattern provided in the first vertical channel hole and adjacent to the bottom surface of the second stack structure. An upper portion of an inner side surface of the first vertical channel hole may include a first position and a second position, which are spaced apart from each other and are located at a same level, and a width of the buffer pattern on the first position may be different from a width of the buffer pattern on the second position.

According to some example embodiments of the inventive concepts, a three-dimensional semiconductor memory device may include a block structure on a substrate, a vertical channel hole penetrating the block structure and exposing the substrate, an inner side surface of the vertical channel hole being bent to provide a corner region, and a buffer pattern placed in the corner region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A to 13A are sectional views sequentially illustrating a process of fabricating a three-dimensional semiconductor memory device having the vertical section of FIG. 4A.

FIGS. 8B to 13B are sectional views sequentially illustrating a process of fabricating a three-dimensional semiconductor memory device having the vertical section of FIG. 4B.

These figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
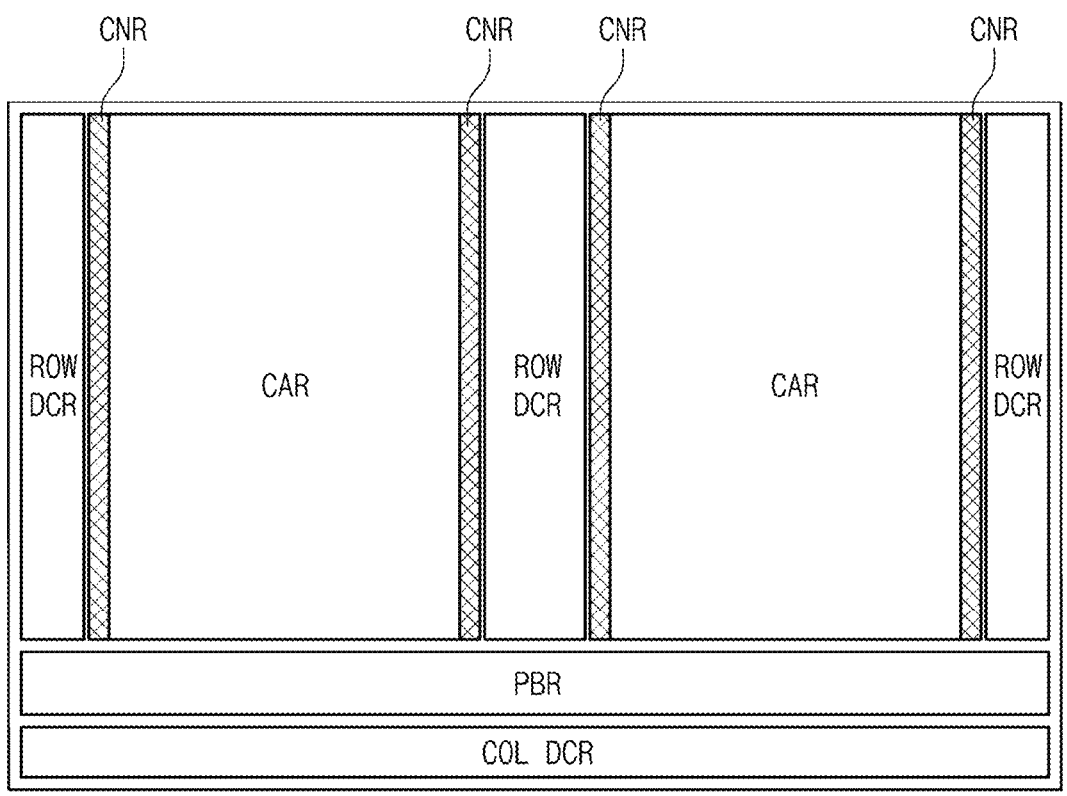
FIG. 1 is a schematic diagram illustrating a three-dimensional semiconductor memory device according to some example embodiments of the inventive concepts.

FIG. 1 is a schematic diagram illustrating a three-dimensional semiconductor memory device according to some example embodiments of the inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some example embodiments, a connection region CNR may be provided between the cell array region CAR and each of the row decoder regions ROW DCR.

A memory cell array including a plurality of memory cells may be provided in the cell array region CAR. In some example embodiments, the memory cell array may include the memory cells which are three-dimensionally arranged, and a plurality of word lines and a plurality of bit lines which are electrically connected to the memory cells.

In the row decoder region ROW DCR, a row decoder may be provided to select the word lines of the memory cell array, and in the connection region CNR, an interconnection structure including contact plugs and interconnection lines may be provided to electrically connect the memory cell array to the row decoder. The row decoder may be configured to select at least one of the word lines, based on address information. The row decoder may be configured to provide word line voltages to selected and unselected instances of the word lines in response to control signals from a control circuit (not shown).

In the page buffer region PBR, a page buffer may be provided to read out data stored in the memory cells. Depending on an operation mode, the page buffer may be used to temporarily store data in the memory cells or to read out data stored in the memory cells. For example, the page buffer may function as a write driver in a program operation mode or as a sense amplifier in a read operation mode.

A column decoder connected to the bit lines of the memory cell array may be provided in the column decoder region COL DCR. The column decoder may provide data-transmission paths between the page buffer and an external device (e.g., a memory controller).

Figure 2:
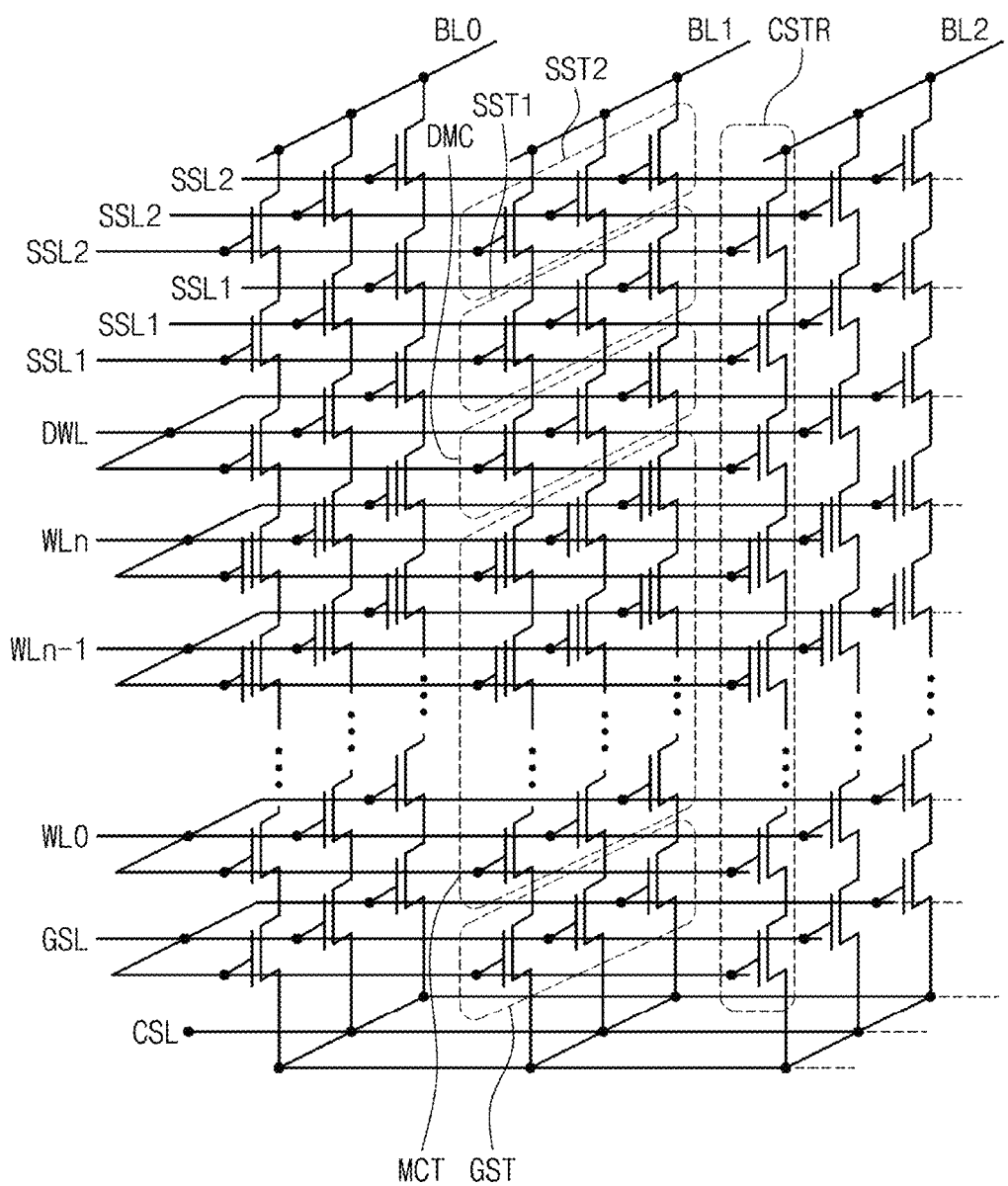
FIG. 2 is a circuit diagram of a three-dimensional semiconductor memory device according to some example embodiments of the inventive concepts.

FIG. 2 is a circuit diagram of a three-dimensional semiconductor memory device according to some example embodiments of the inventive concept.

Referring to FIG. 2, the memory cell array of the three-dimensional semiconductor memory device may include a common source line CSL, a plurality of bit lines BL0-BL2, and a plurality of cell strings CSTR between the common source line CSL and the bit lines BL0-BL2.

The bit lines BL0-BL2 may be two-dimensionally arranged, and a plurality of the cell strings CSTR may be connected in parallel to each of the bit lines BL0-BL2. The cell strings CSTR may be connected in common to the common source line CSL. In other words, a plurality of the cell strings CSTR may be provided between the bit lines BL0-BL2 and the single common source line CSL. In some example embodiments, a plurality of the common source lines CSL may be two-dimensionally arranged. The common source lines CSL may be applied with the same voltage or may be independently controlled.

In some example embodiments, each of the cell strings CSTR may include string selection transistors SST1 and SST2 which are connected in series, memory cell transistors MCT which are connected in series, and a ground selection transistor GST. Each of the memory cell transistors MCT may include a data storage element.

As an example, each of the cell strings CSTR may include first and second string selection transistors SST1 and SST2, which are connected in series, the second string selection transistors SST2 may be coupled to the bit lines BL0-BL2, and the ground selection transistor GST may be coupled to the common source line CSL. The memory cell transistors MCT may be connected in series to each other, between the first string selection transistor SST1 and the ground selection transistor GST.

Furthermore, each of the cell strings CSTR may further include a dummy cell DMC, which is provided between and connected to the first string selection transistor SST1 and the memory cell transistor MCT. Although not shown, the dummy cell DMC may be provided between and connected to the ground selection transistor GST and the memory cell transistor MCT.

In some example embodiments, in each of the cell strings CSTR, the ground selection transistor GST may include a plurality of metal-oxide-semiconductor (MOS) transistors, which are connected in series, similar to the first and second string selection transistors SST1 and SST2. In certain embodiments, each of the cell strings CSTR may be configured to include a single string selection transistor.

In some example embodiments, the first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cells DMC may be controlled by a dummy word line DWL. The ground selection transistor GST may be controlled by a ground selection line GSL. The common source line CSL may be connected in common to sources of the ground selection transistors GST.

Each of the cell strings CSTR may include a plurality of the memory cell transistors MCT located at different heights from the common source lines CSL. A plurality of the word lines WL0-WLn and DWL may be provided between the common source lines CSL and the bit lines BL0-BL2.

Gate electrodes of the memory cell transistors MCT, which are placed at substantially the same height from the common source lines CSL, may be connected in common to one of the word lines WL0-WLn and DWL, thereby being in an equipotential state. Alternatively, although the gate electrodes of the memory cell transistors MCT are placed at the substantially same height from the common source lines CSL, some of the gate electrodes may be placed in different rows or columns and may be independently controlled.

Figure 3:
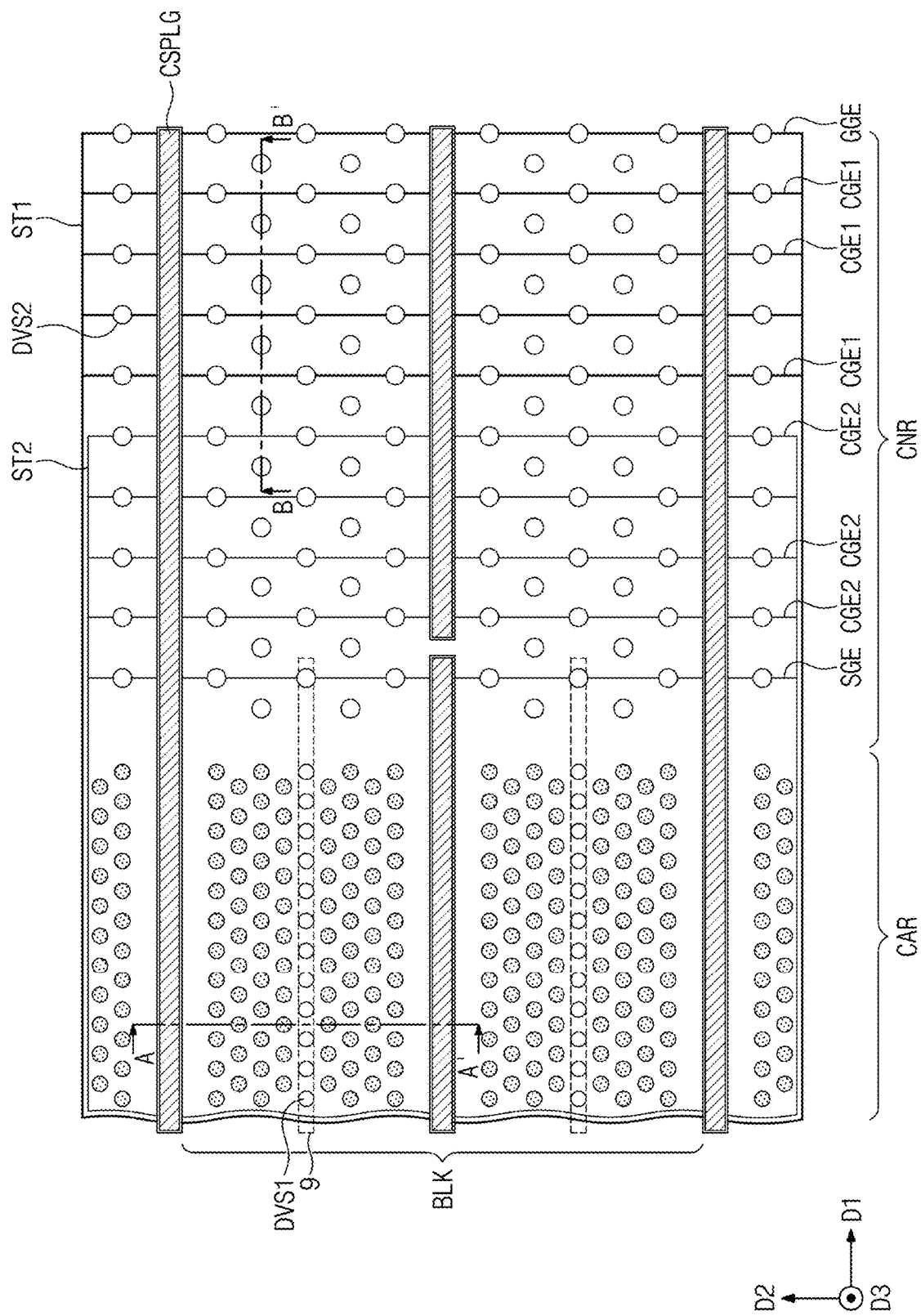
FIG. 3 is a plan view illustrating a three-dimensional semiconductor device according to some example embodiments of the inventive concepts.
Figure 4A:
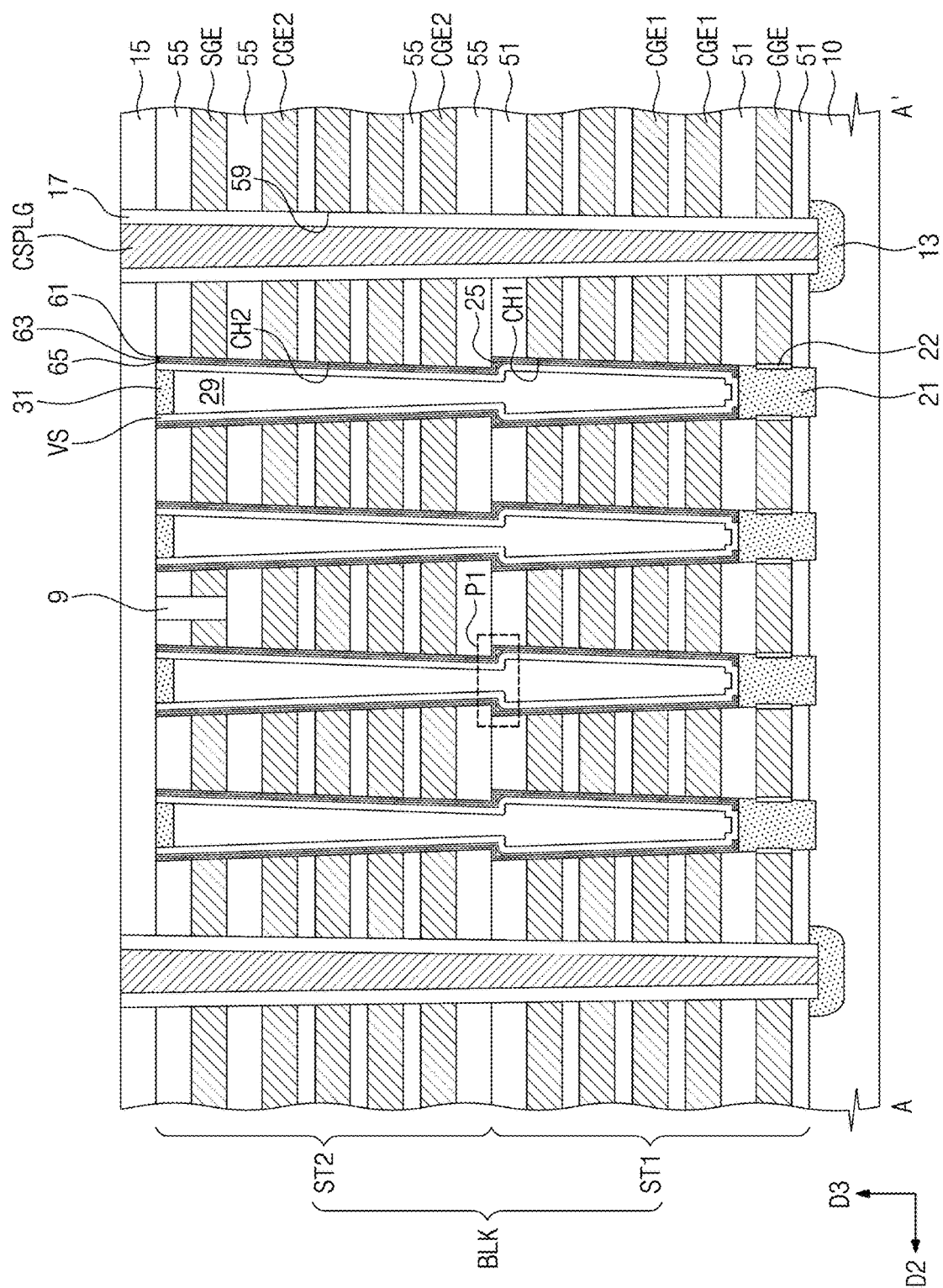
FIG. 4A is a sectional view illustrating a vertical section taken along a line A-A' of FIG. 3.
Figure 4B:
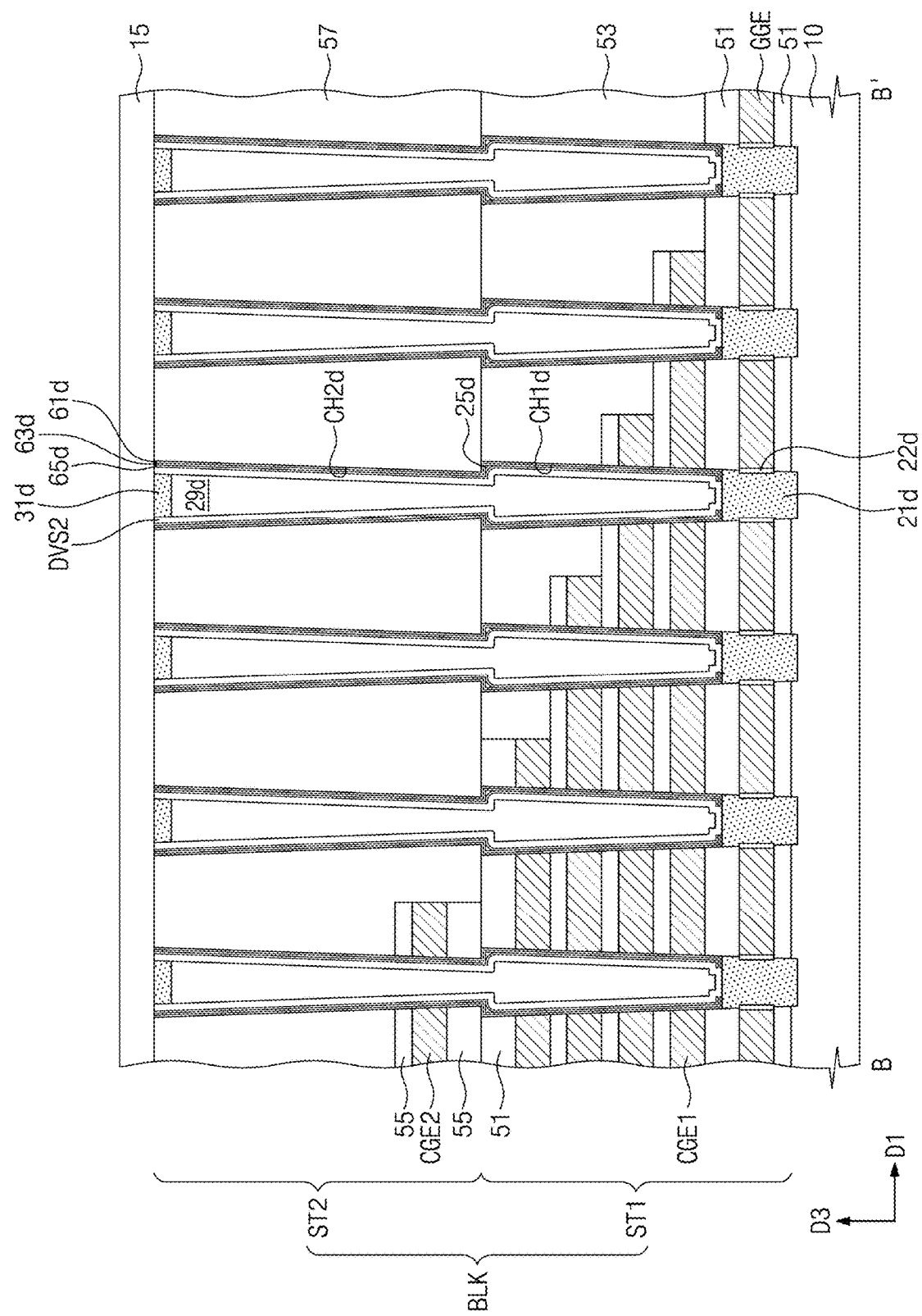
FIG. 4B is a sectional view illustrating a vertical section taken along a line B-B' of FIG. 3.

FIG. 3 is a plan view illustrating a three-dimensional semiconductor device according to some example embodiments of the inventive concept. FIG. 4A is a sectional view illustrating a vertical section taken along a line A-A' of FIG. 3. FIG. 4B is a sectional view illustrating a vertical section taken along a line B-B' of FIG. 3.

Referring to FIGS. 3, 4A, and 4B, a substrate 10 may include a cell array region CAR and a connection region CNR arranged in a first direction D1. The connection region CNR may be provided along a side edge of the cell array region CAR. The substrate 10 may include at least one of a semiconductor material (e.g., silicon), an insulating material (e.g., glass), or a semiconductor or conductive material covered with an insulating material. The substrate 10 may be doped with impurities to have, for example, a first conductivity type.

The three-dimensional semiconductor memory device may include a block structure BLK provided on the substrate 10. In some example embodiments, a plurality of the block structures BLK may be arranged in a second direction D2 that is not parallel to the first direction D1. Source contact plugs CSPLG may be provided between adjacent block structures BLK. In addition, the source contact plug CSPLG may be provided in a central portion of each block structure BLK to divide each block structure BLK into two regions. An insulating spacer 17 formed of an insulating material may be provided between the source contact plugs CSPLG and the block structure BLK. The source contact plugs CSPLG may be formed of or include at least one of doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The source contact plugs CSPLG and the insulating spacer 17 may be placed in a source groove 59. The source contact plugs CSPLG may be in contact with a common source region 13, which is formed in the substrate 10. The common source region 13 may serve as the common source line CSL of FIG. 2.

The block structure BLK may include a first stack structure ST1 and a second stack structure ST2, which are sequentially stacked on the substrate 10. The second stack structure ST2 may be covered with an upper insulating layer 15. The first stack structure ST1 may include a ground selection gate electrode GGE and first cell gate electrodes CGE1, which are stacked in a third direction D3 (e.g., a vertical direction) perpendicular to the first and second directions D1 and D2, and first gate interlayered insulating layers 51 interposed therebetween. The second stack structure ST2 may include second cell gate electrodes CGE2 and a string selection gate electrode SGE, which are stacked in the third direction D3, and second gate interlayered insulating layers 55 interposed therebetween. The gate electrodes GGE, CGE1, CGE2, and SGE may be formed of or include at least one of doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The first and second gate interlayered insulating layers 51 and 55 may include at least one of a silicon oxide layer and/or low-k dielectric layers. The topmost layer of the first stack structure ST1 may be one of the first gate interlayered insulating layers 51. The bottommost layer of the second stack structure ST2 may be one of the second gate interlayered insulating layers 55.

The ground selection gate electrodes GGE may be provided at two or more different levels, and the string selection gate electrode SGE may be provided at two or more different levels. Distances between the gate electrodes GGE, CGE1, CGE2, and SGE may be controlled in consideration of technical requirement for the three-dimensional semiconductor device. For example, the smallest distance between the ground selection gate electrode GGE and the first cell gate electrode CGE1 may be larger than distances between the first cell gate electrodes CGE1. The smallest distance between the string selection gate electrode SGE and the second cell gate electrode CGE2 may be larger than distances between the second cell gate electrodes CGE2. The cell gate electrodes CGE1 and CGE2 may be used as the word lines WL0-WLn and DWL (e.g., the control gate electrodes of the memory and dummy cell transistors MCT and DMC of FIG. 2).

A plurality of vertical semiconductor patterns VS and a plurality of first dummy vertical semiconductor patterns DVS1 may be provided on the cell array region CAR to penetrate the second stack structure ST2 and the first stack structure ST1 and to be in contact with the substrate 10. The first dummy vertical semiconductor patterns DVS1 may be arranged in a central portion of a region of the block structure BLK to form one row parallel to the first direction D1. Insulating separation patterns 9 may be provided between upper portions of the first dummy vertical semiconductor patterns DVS1. In a region of each block structure BLK, the string selection gate electrode SGE may be divided into two parts by the row of the first dummy vertical semiconductor patterns DVS1, which are arranged parallel to the first direction D1, and the insulating separation patterns 9, which are interposed between the upper portions of the first dummy vertical semiconductor patterns DVS1. In each block structure BLK, the string selection gate electrodes SGE may be spaced apart from each other in the second direction. The string selection gate electrodes SGE may be used as gate electrodes of string selection transistors SST1 or SST2 of FIG. 2. That is, the string selection gate electrodes SGE may be used to control electric connection between a bit line BL and the vertical semiconductor patterns VS.

The block structure BLK may have a staircase structure on the connection region CNR. In other words, the gate electrodes GGE, CGE1, CGE2, and SGE of the first and second stack structures ST1 and ST2 may have a decreasing length in the first direction D1, with increasing distance from the substrate 10. Each of the gate electrodes GGE, CGE1, CGE2, and SGE may have a pad portion (not shown) on the connection region CNR. The first stack structure ST1 may further include a first interlayered insulating layer 53, which is provided to cover end portions of the ground selection gate electrode GGE and the first cell gate electrodes CGE1. A top surface of the first interlayered insulating layer 53 may be coplanar with a top surface of the uppermost one of the first gate interlayered insulating layers 51. The second stack structure ST2 may further include a second interlayered insulating layer 57, which is provided to cover end portions of the second cell gate electrodes CGE2 and the string selection gate electrode SGE and the first interlayered insulating layer 53. A top surface of the second interlayered insulating layer 57 may be coplanar with a top surface of the uppermost one of the second gate interlayered insulating layers 55.

A plurality of second dummy vertical semiconductor patterns DVS2 may be provided on the connection region CNR to penetrate the second stack structure ST2 and the first stack structure ST1 and to be in contact with the substrate 10. The second dummy vertical semiconductor patterns DVS2 may penetrate the pad portions of the gate electrodes, on the connection region CNR. Widths of the second dummy vertical semiconductor patterns DVS2 may be larger than widths of the vertical semiconductor patterns VS and the first dummy vertical semiconductor patterns DVS1. Each of the vertical semiconductor patterns VS and the first and second dummy vertical semiconductor patterns DVS1 and DVS2 may be formed of or include a doped or un-doped silicon layer having a single or poly-crystalline structure.

Figure 5:
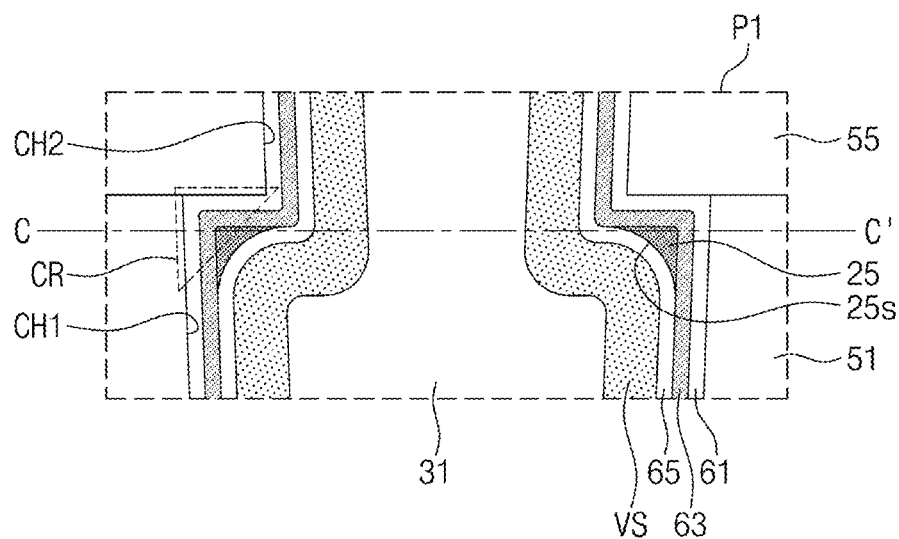
FIGS. 5 and 7 are enlarged sectional views each illustrating a vertical section of a portion 'P1' of FIG. 4A.
Figure 6:
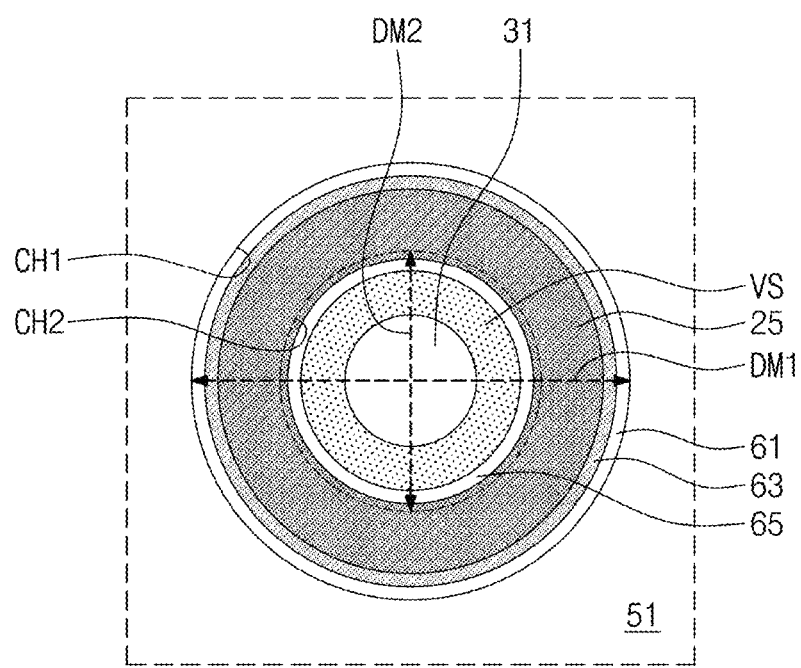
FIG. 6 is a sectional view illustrating a horizontal section taken along a line C-C' of FIG. 5.
Figure 7:
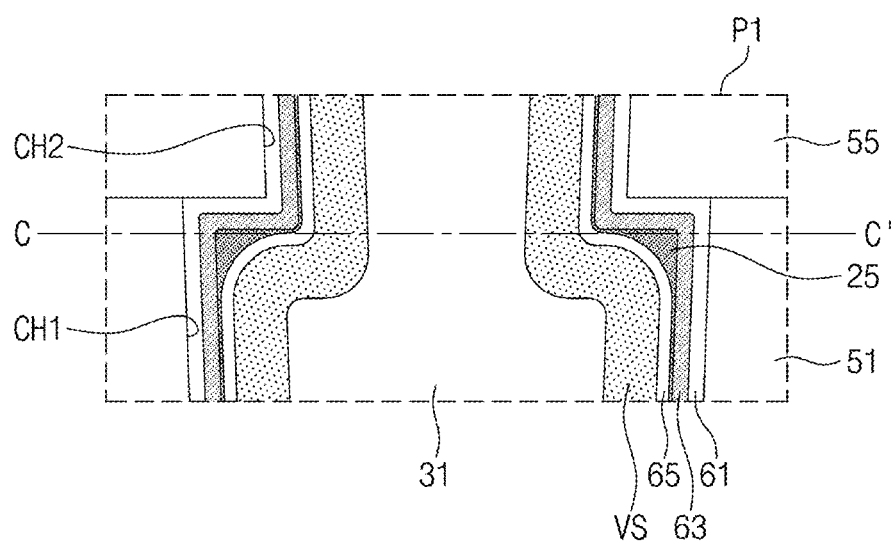

FIGS. 5 and 7 are enlarged sectional views each illustrating a vertical section of a portion 'P1' of FIG. 4A. FIG. 6 is a sectional view illustrating a horizontal section taken along a line C-C' of FIG. 5.

Referring to FIGS. 3, 4A, 5, and 6, a first vertical channel hole CH1 may penetrate the first stack structure ST1 and expose the substrate 10. A second vertical channel hole CH2 may penetrate the second stack structure ST2 and expose the first vertical channel hole CH1. The first vertical channel hole CH1 and the second vertical channel hole CH2 may be vertically overlapped to each other. Each of the first vertical channel hole CH1 and the second vertical channel hole CH2 may be provided in such a way that its top diameter is larger than its bottom diameter. For example, the first vertical channel hole CH1 may have a first diameter DM1 at its top level, and the second vertical channel hole CH2 may have a second diameter DM2 at its bottom level. The first diameter DM1 may be larger than the second diameter DM2. Thus, a bottom surface of the second gate interlayered insulating layer 55 may be exposed, at the top level of the first vertical channel hole CH1.

The vertical semiconductor pattern VS may be provided in the first vertical channel hole CH1 and the second vertical channel hole CH2. The vertical semiconductor pattern VS may have a bent sectional profile, near a border between the first vertical channel hole CH1 and the second vertical channel hole CH2. The vertical semiconductor pattern VS may have a hollow cup shape. An internal space of the cup-shaped vertical semiconductor pattern VS may be partially filled with a conductive pad 31. A tunnel insulating pattern 65, a charge storing pattern 63, and a blocking insulating pattern 61 may be interposed between the vertical semiconductor pattern VS and a side surface of the first vertical channel hole CH1 and between the vertical semiconductor pattern VS and a side surface of the second vertical channel hole CH2. The blocking insulating pattern 61 may include at least one of a silicon oxide layer or high-k dielectric layers (e.g., aluminum oxide and hafnium oxide), whose dielectric constants are higher than that of silicon oxide. The charge storing pattern 63 may include at least one of a silicon nitride layer, a silicon oxynitride layer, a silicon-rich nitride layer, a nanocrystalline silicon layer, or a laminated trap layer. The tunnel insulating pattern 65 may include at least one of a silicon oxide layer or a silicon oxynitride layer.

A buffer pattern 25 may be provided in the first vertical channel hole CH1 and adjacent to the bottom surface of the second gate interlayered insulating layer 55. The buffer pattern 25 may be interposed between the charge storing pattern 63 and the tunnel insulating pattern 65. When viewed in a plan view, the buffer pattern 25 may have a hollow doughnut or tube shape, as shown in FIG. 6. The buffer pattern 25 may have a first surface 25s that is in contact with the tunnel insulating pattern 65. The first surface 25s may be recessed toward a position, at which the exposed bottom surface of the second gate interlayered insulating layer 55 meets an upper portion of an inner side surface of the first vertical channel hole CH1.

The buffer pattern 25 may include at least one of a silicon oxynitride layer, a silicon oxide layer, a metal oxide, a poly-silicon layer, a silicon germanium layer, and a germanium layer. In certain embodiments, the buffer pattern 25 and the tunnel insulating pattern 65 may include nitrogen-containing materials. For example, each of the buffer pattern 25 and the tunnel insulating pattern 65 may include a silicon oxynitride layer. Here, the nitrogen content in the buffer pattern 25 may be different from that in the tunnel insulating pattern 65.

The buffer pattern 25 may be provided to fill at least a portion of a corner region CR, which is defined by the upper portion of the inner side surface of the first vertical channel hole CH1 and the bottom surface of the second gate interlayered insulating layer 55 exposed by the first vertical channel hole CH1. Due to the presence of the buffer pattern 25, the vertical semiconductor pattern VS may be smoothly bent near the corner region CR. Thus, the vertical semiconductor pattern VS may be formed to have a substantially uniform thickness, regardless of vertical position. In addition, the vertical semiconductor pattern VS may be reduced or prevented from being cut and from having a non-uniform thickness, and thus, reliability of the three-dimensional semiconductor memory device may be improved.

A lower semiconductor pad 21 may be provided below the first vertical channel hole CH1. The lower semiconductor pad 21 may be a semiconductor epitaxial pattern. The lower semiconductor pad 21 may be in contact with the vertical semiconductor pattern VS. The conductive pad 31 may be provided near or in the top end of the second vertical channel hole CH2. The conductive pad 31 may be in contact with the vertical semiconductor pattern VS. The conductive pad 31 may be connected to a bit line (not shown).

A ground gate insulating layer 22 may be interposed between the lower semiconductor pad 21 and the ground selection gate electrode GGE. The ground gate insulating layer 22 may include, for example, a silicon oxide layer.

Referring to FIG. 7, the buffer pattern 25 may include a portion which is extended to cover an inner side surface of the second vertical channel hole CH2 and a lower portion of the inner side surface of the first vertical channel hole CH1. Here, a thickness of the buffer pattern 25 on the inner side surface of the second vertical channel hole CH2 and the lower portion of the inner side surface of the first vertical channel hole CH1 may be smaller than that on the upper portion of the inner side surface of the first vertical channel hole CH1.

Although their sections are not illustrated, the first dummy vertical semiconductor pattern DVS1 and its neighboring elements may have the same or similar structure to the vertical semiconductor pattern VS and its neighboring elements.

Referring back to FIG. 4B, first dummy vertical channel holes CH1d may be provided on the connection region CNR to penetrate the first stack structure ST1 and to expose the substrate 10. Second dummy vertical channel holes CH2d may be provided to penetrate the second stack structure ST2 and to expose the first dummy vertical channel holes CH1d, respectively. At least one of the first dummy vertical channel holes CH1d may be spaced apart from the first interlayered insulating layer 53. Others of the first dummy vertical channel holes CH1d may be provided to penetrate the first interlayered insulating layer 53. At least one of the second dummy vertical channel holes CH2d spaced apart from the first interlayered insulating layer 53 may penetrate the second interlayered insulating layer 57 and at least one of the second cell gate electrodes CGE2. The others of the second dummy vertical channel holes CH2d may be spaced apart from the second cell gate electrodes CGE2 and may penetrate the second interlayered insulating layer 57. Each of the second dummy vertical semiconductor patterns DVS2 may be provided in a corresponding pair of the first dummy vertical channel hole CH1d and the second dummy vertical channel hole CH2d. Each of the second dummy vertical semiconductor patterns DVS2 may have the same or similar structure as that of the vertical semiconductor pattern VS. A dummy tunnel insulating pattern 65d, a dummy charge storing pattern 63d and a dummy blocking insulating pattern 61d may be interposed between the second dummy vertical semiconductor pattern DVS2 and an inner side surface of the first dummy vertical channel hole CH1d and between the second dummy vertical semiconductor pattern DVS2 and an inner side surface of the second dummy vertical channel hole CH2d. In a region adjacent to an upper portion of the inner side surface of the first dummy vertical channel hole CH1d, a dummy buffer pattern 25d may be interposed between the dummy tunnel insulating pattern 65d and the dummy charge storing pattern 63d. The dummy buffer pattern 25d may have the same or similar structure as that of the buffer pattern 25 described above.

A dummy lower semiconductor pad 21d may be provided below the first dummy vertical channel hole CH1d. A dummy ground gate insulating layer 22d may be interposed between the dummy lower semiconductor pad 21d and the ground selection gate electrode GGE. Each of the second dummy vertical semiconductor patterns DVS2 may have a hollow cup shape and may be filled with a dummy insulating filling pattern 29d. Dummy conductive pads 31d may be provided on the second dummy vertical semiconductor patterns DVS2, respectively. The dummy conductive pads 31d may not be electrically connected to the bit line (not shown).

FIGS. 8A to 13A are sectional views sequentially illustrating a process of fabricating a three-dimensional semiconductor memory device having the vertical section of FIG. 4A. FIGS. 8B to 13B are sectional views sequentially illustrating a process of fabricating a three-dimensional semiconductor memory device having the vertical section of FIG. 4B.

Figure 8B:
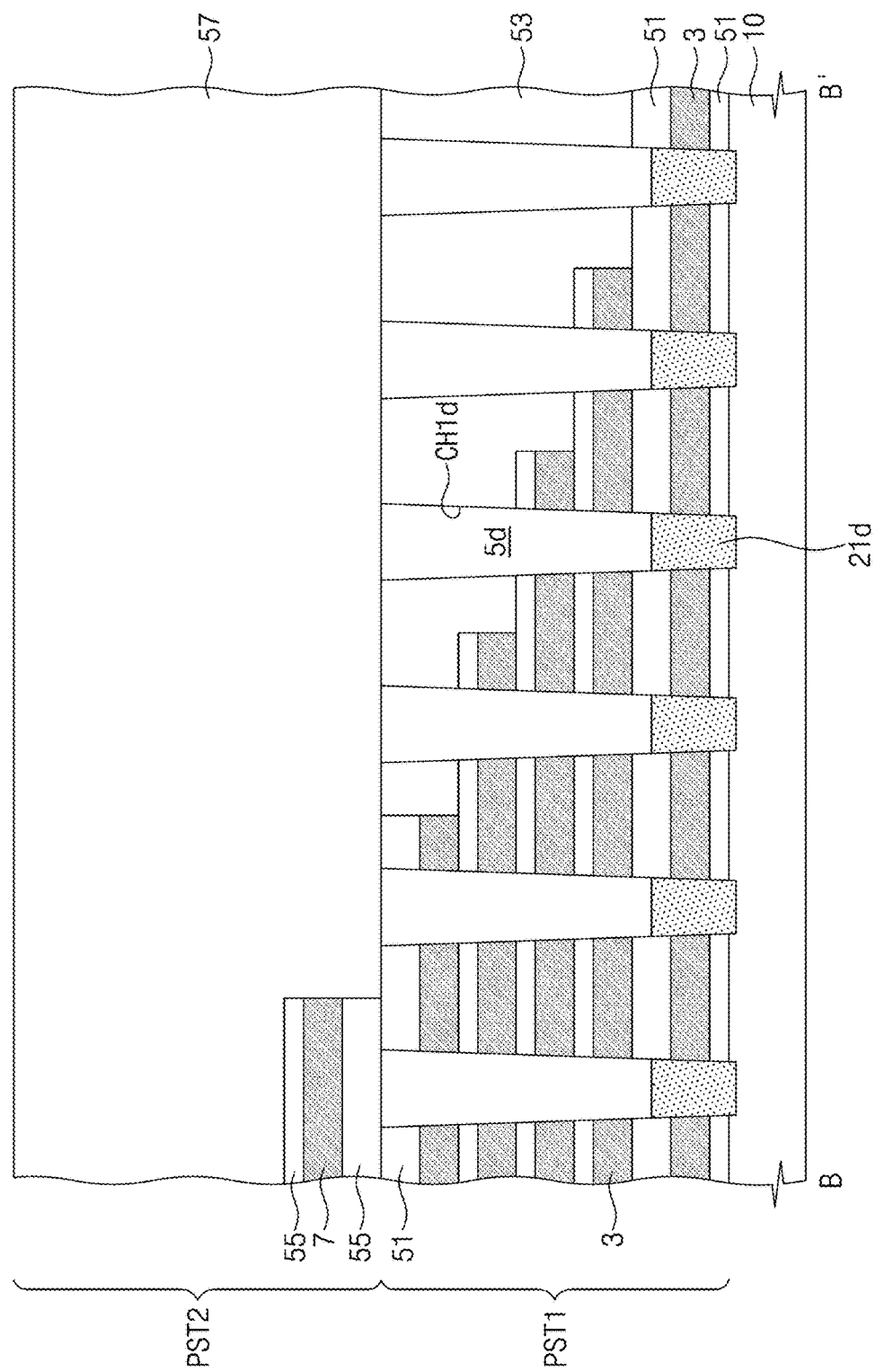

Referring to FIGS. 3, 8A, and 8B, first gate interlayered insulating layers 51 and first sacrificial layers 3 may be alternately stacked on the substrate 10. The first gate interlayered insulating layers 51 may be formed of, for example, a silicon oxide layer. The first sacrificial layers 3 may be formed of a material (e.g., silicon nitride) having an etch selectivity with respect to the first gate interlayered insulating layers 51. A trimming process and an etching process may be repeated several times to allow the first sacrificial layers 3 and the first gate interlayered insulating layers 51 to have staircase end portions, and here, the trimming process may refer to a process of etching a mask pattern, which is used for the etching process on the first sacrificial layers 3 and the first gate interlayered insulating layers 51. The first interlayered insulating layer 53 may be formed on the connection region CNR to cover the end portions of the first gate interlayered insulating layers 51 and the first sacrificial layers 3, and as a result, a first preliminary stack structure PST1 may be formed. The first preliminary stack structure PST1 on the cell array region CAR and the connection region CNR may be patterned to form a plurality of first vertical channel holes CH1 and a plurality of first dummy vertical channel holes CH1d exposing the substrate 10. The first vertical channel holes CH1 and the first dummy vertical channel holes CH1d may be formed to have side surfaces that are inclined at an angle to the top surface of the substrate 10. A selective epitaxial growth (SEG) process may be performed to form the lower semiconductor pads 21 and the dummy lower semiconductor pads 21d in lower regions of the first vertical channel holes CH1 and the first dummy vertical channel holes CH1d. Sacrificial gapfill patterns 5 and dummy sacrificial gapfill patterns 5d may be formed to fill the remaining portions of the first vertical channel holes CH1 and the first dummy vertical channel holes CH1d, respectively.

Second gate interlayered insulating layers 55 and second sacrificial layers 7 may be alternately stacked on the first preliminary stack structure PST1. A trimming process may be performed to allow the second sacrificial layers 7 and the second gate interlayered insulating layers 55 to have staircase end portions. The second interlayered insulating layer 57 may be formed on the connection region CNR to cover the end portions of the second gate interlayered insulating layers 55 and the second sacrificial layers 7, and as a result, a second preliminary stack structure PST2 may be formed. A groove may be formed by patterning at least the uppermost pair of the second gate interlayered insulating layer 55 and the second sacrificial layer 7 on the cell array region CAR, and then, the insulating separation pattern 9 may be formed by filling the groove with an insulating layer.

Figure 9A:
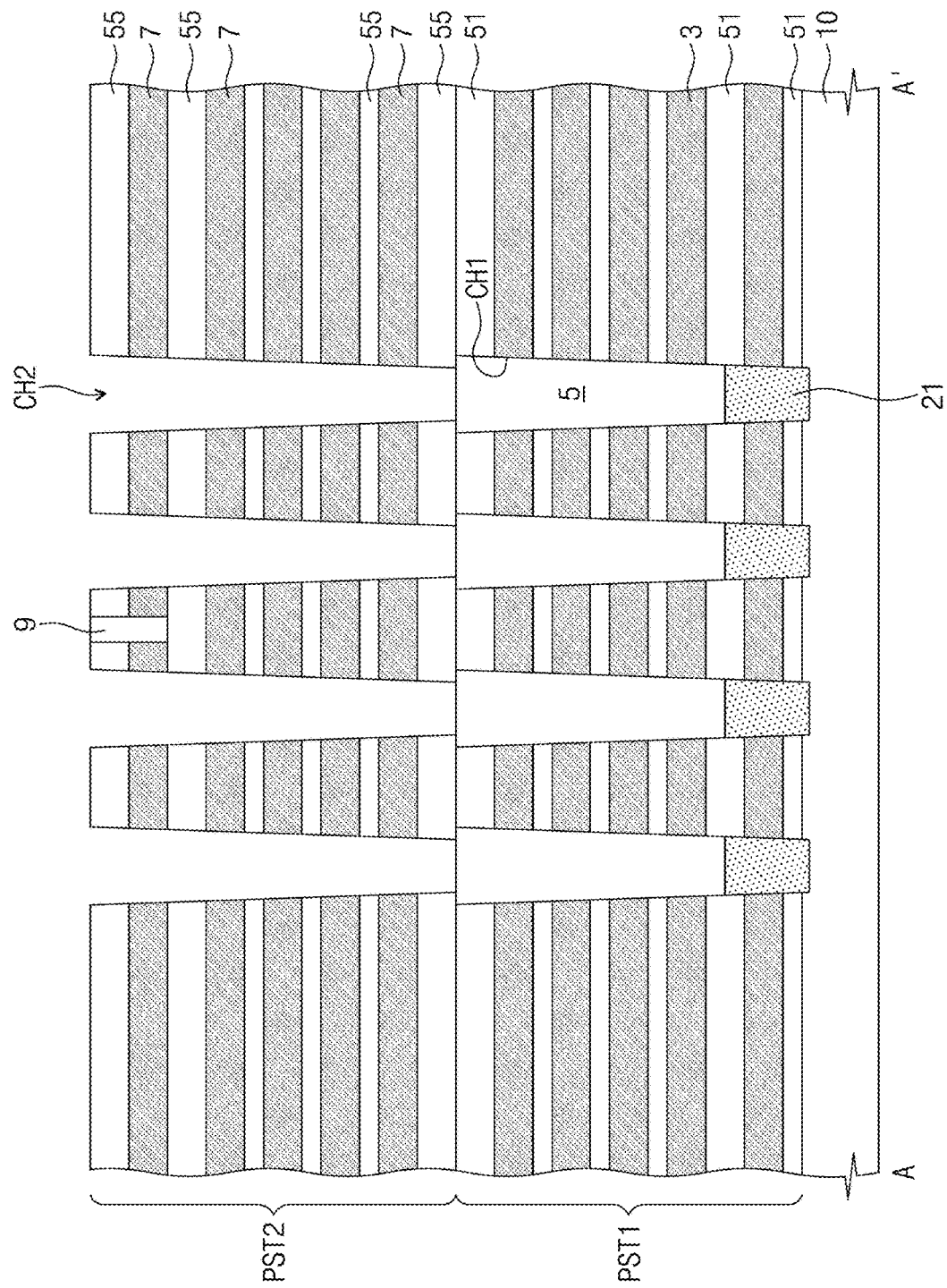
Figure 9B:
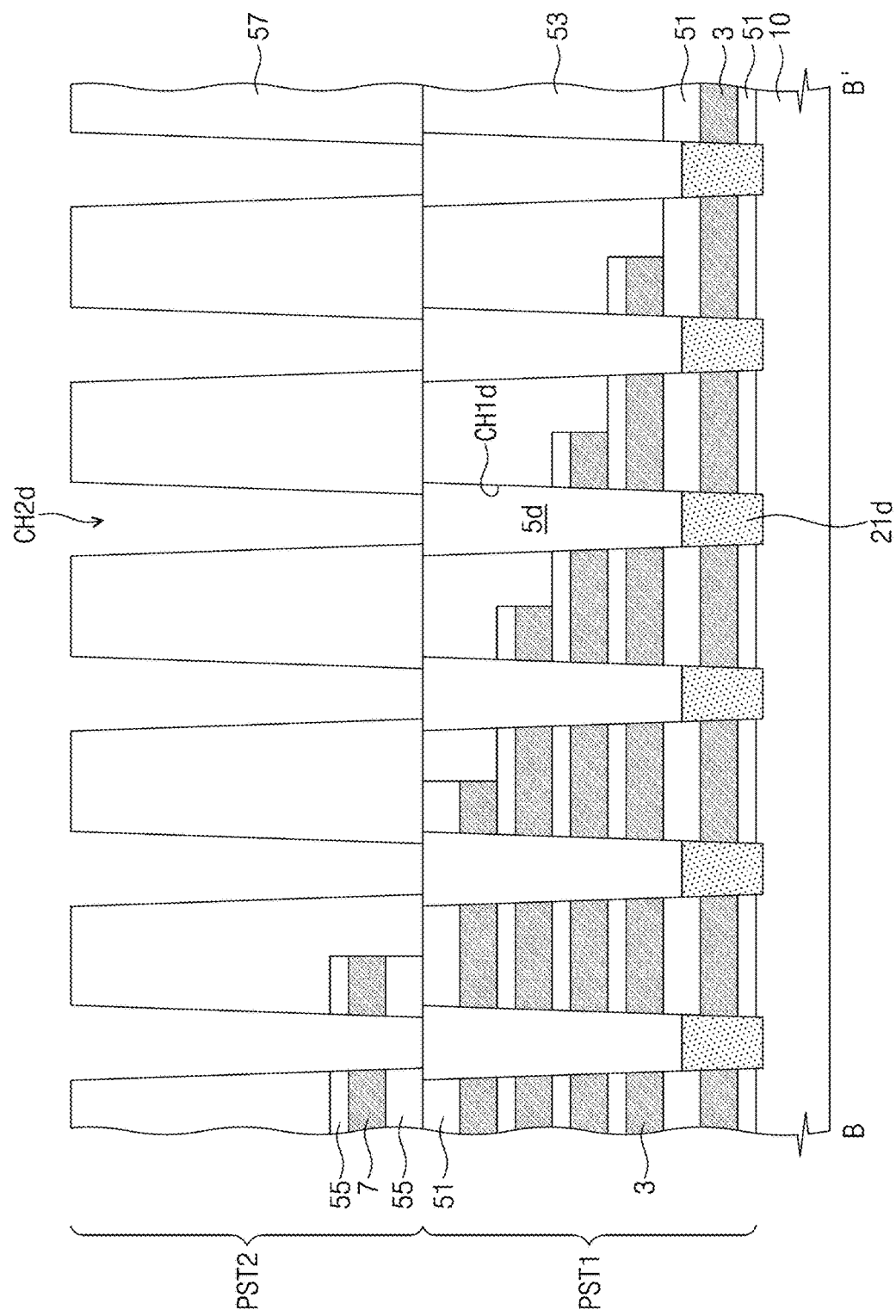

Referring to FIGS. 9A and 9B, the second preliminary stack structure PST2 may be etched to form the second vertical channel holes CH2 and the second dummy vertical channel holes CH2d exposing the sacrificial gapfill patterns 5 and the dummy sacrificial gapfill patterns 5d, respectively, on the cell array region CAR and the connection region CNR. The second vertical channel holes CH2 and the second dummy vertical channel holes CH2d may be formed to have side surfaces, which are inclined at an angle to the top surface of the substrate 10.

Figure 10A:
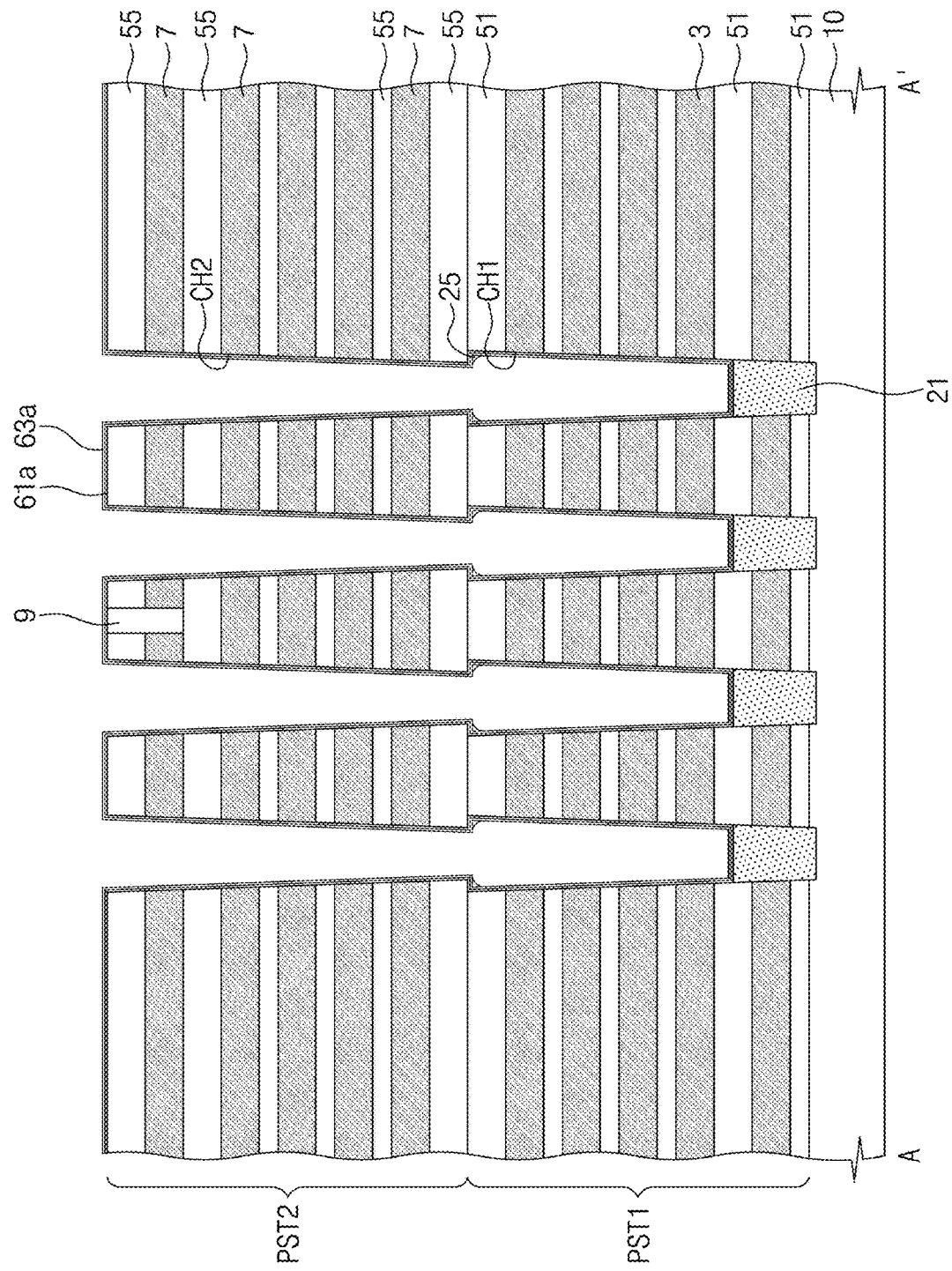
Figure 10B:
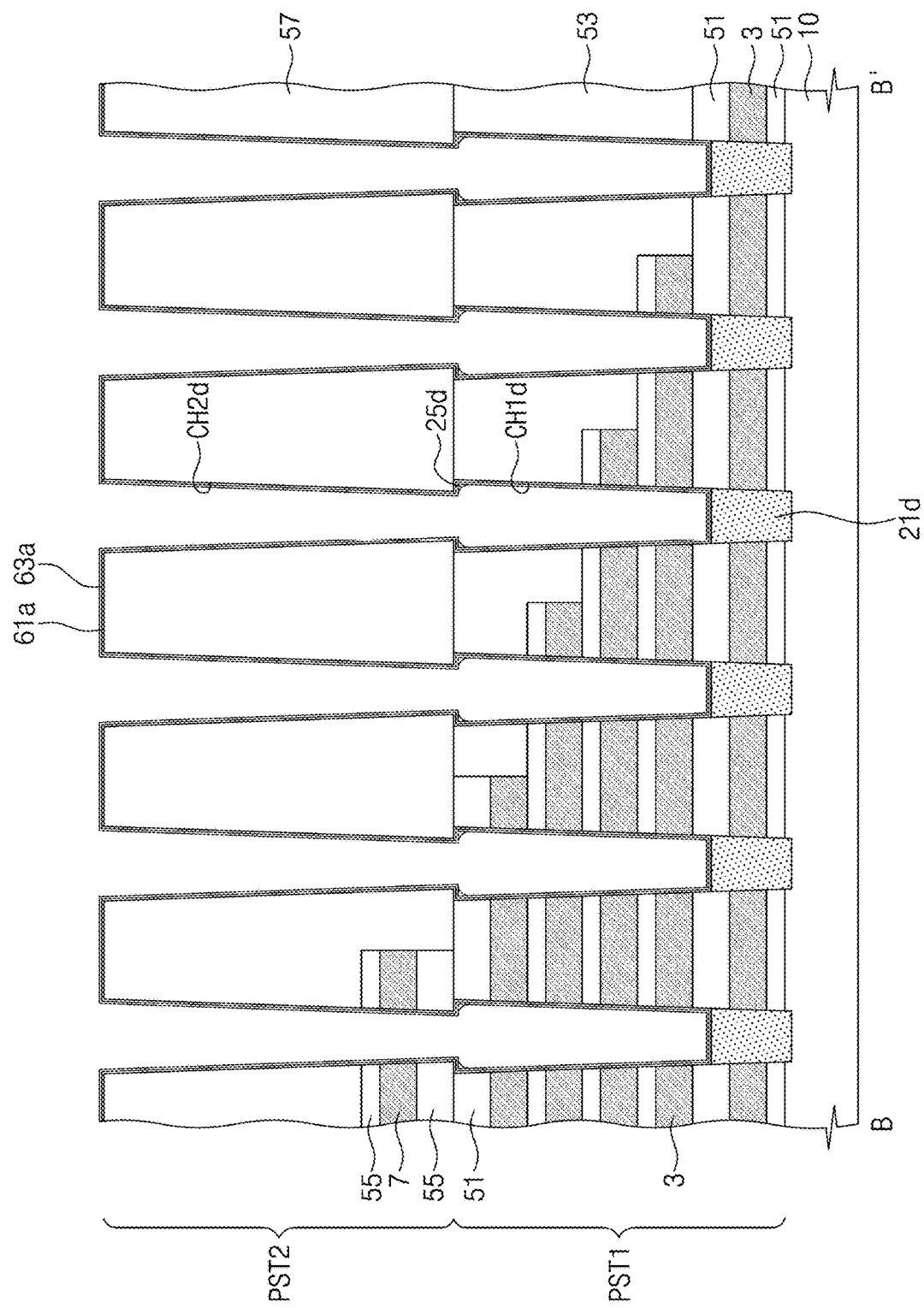

Referring to FIGS. 10A and 10B, the sacrificial gapfill patterns 5 and the dummy sacrificial gapfill patterns 5d exposed through the second vertical channel holes CH2 and the second dummy vertical channel holes CH2d may be removed to expose the inner side surfaces of the first vertical channel holes CH1 and the first dummy vertical channel holes CH1d as well as the lower semiconductor pads 21 and the dummy lower semiconductor pads 21d. A first blocking insulating layer 61a and a charge storing layer 63a may be sequentially and conformally formed on the substrate 10. Thereafter, a buffer layer may be conformally formed on the charge storing layer 63a. The buffer layer may be formed to sufficiently fill the corner region CR (e.g., see of FIG. 5) defined by the upper portion of the inner side surface of the first vertical channel hole CH1 and the bottom surface of the second stack structure ST2. For example, the buffer layer may have a relatively large thickness, in the corner region CR. Thereafter, a trimming or isotropic etching process using a first etchant may be performed to remove the buffer layer from the inner side surface of the second vertical channel hole CH2 and from intermediate and lower portions of the inner side surface of the first vertical channel hole CH1. However, it may be relatively difficult for the first etchant to be supplied to the corner region and the buffer layer is relatively thicker at the corner region, so that a portion of the buffer layer may remain in the corner region. Thus, the buffer pattern 25 may be formed in an upper portion of the first vertical channel hole CH1. Similarly, the dummy buffer pattern 25d may be formed in the first dummy vertical channel hole CH1d. The first etchant may be a gaseous or liquid material containing hydrofluoric acid or sulfuric acid. The buffer pattern 25 and the dummy buffer pattern 25d may have the shape described with reference to FIGS. 5 to 7.

Figure 11A:
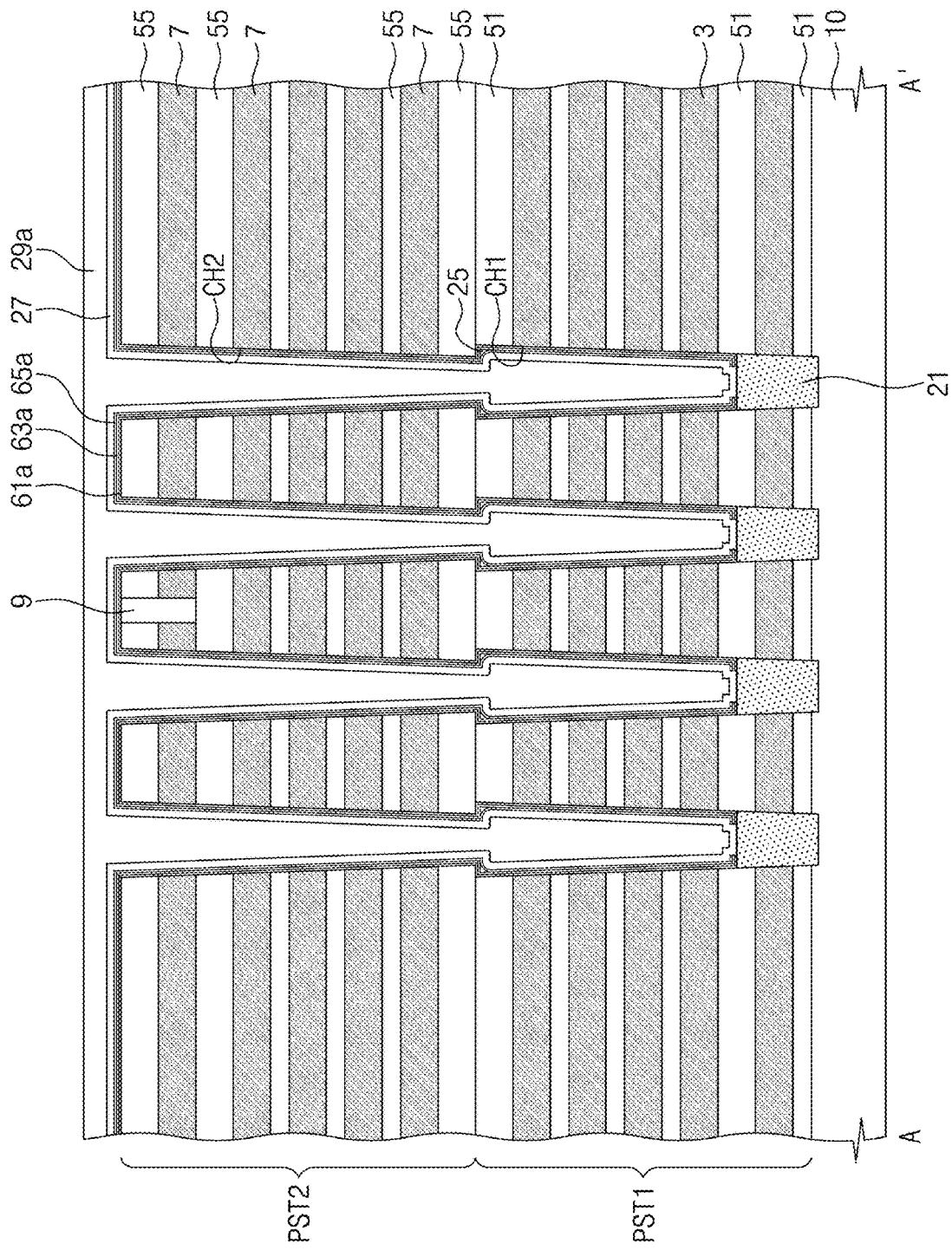

Referring to FIGS. 11A and 11B, a tunnel insulating layer 65a may be conformally formed on the substrate 10. An anisotropic etching process may be performed to sequentially etch the tunnel insulating layer 65a, the charge storing layer 63a, and the blocking insulating layer 61a, and as a result, the lower semiconductor pad 21 and the dummy lower semiconductor pad 21d may be respectively exposed through bottom portions of the first vertical channel hole CH1 and the first dummy vertical channel hole CH1d. A vertical semiconductor layer 27 may be conformally formed on the entire top surface of the substrate 10 to be in contact with the lower semiconductor pad 21 and the dummy lower semiconductor pad 21d. The formation of the vertical semiconductor layer 27 may include conformally forming a poly-silicon layer to a first thickness, annealing the poly-silicon layer to change the crystal structure of the poly-silicon layer to a single-crystalline structure, and then, performing a trimming or isotropic etching process, in which a second etchant is used, to reduce a thickness of the single-crystalline silicon layer to a second thickness. Next, an insulating gapfill layer 29a may be formed to fill the first and second vertical channel holes CH1 and CH2 and the first and second dummy vertical channel holes CH1d and CH2d.

If the buffer pattern 25 is not provided, the vertical semiconductor layer 27 may be formed to have a sharply bent portion and a sharply protruding portion, near the border portion between the first preliminary stack structure PST1 and the second preliminary stack structure PST2. Thus, during the process of forming the vertical semiconductor layer 27 (in particular, during the trimming process), the vertical semiconductor layer 27 near the border portion may be excessively etched by the second etchant. In severe cases, the vertical semiconductor layer 27 may be cut near the border portion. However, according to some example embodiments of the inventive concept, since the buffer pattern 25 is provided in the border portion, the vertical semiconductor layer 27 may be formed to have a smooth profile, near the border portion. Thus, it may be possible to prevent or suppress the vertical semiconductor layer 27 from being cut by the second etchants.

Figure 12A:
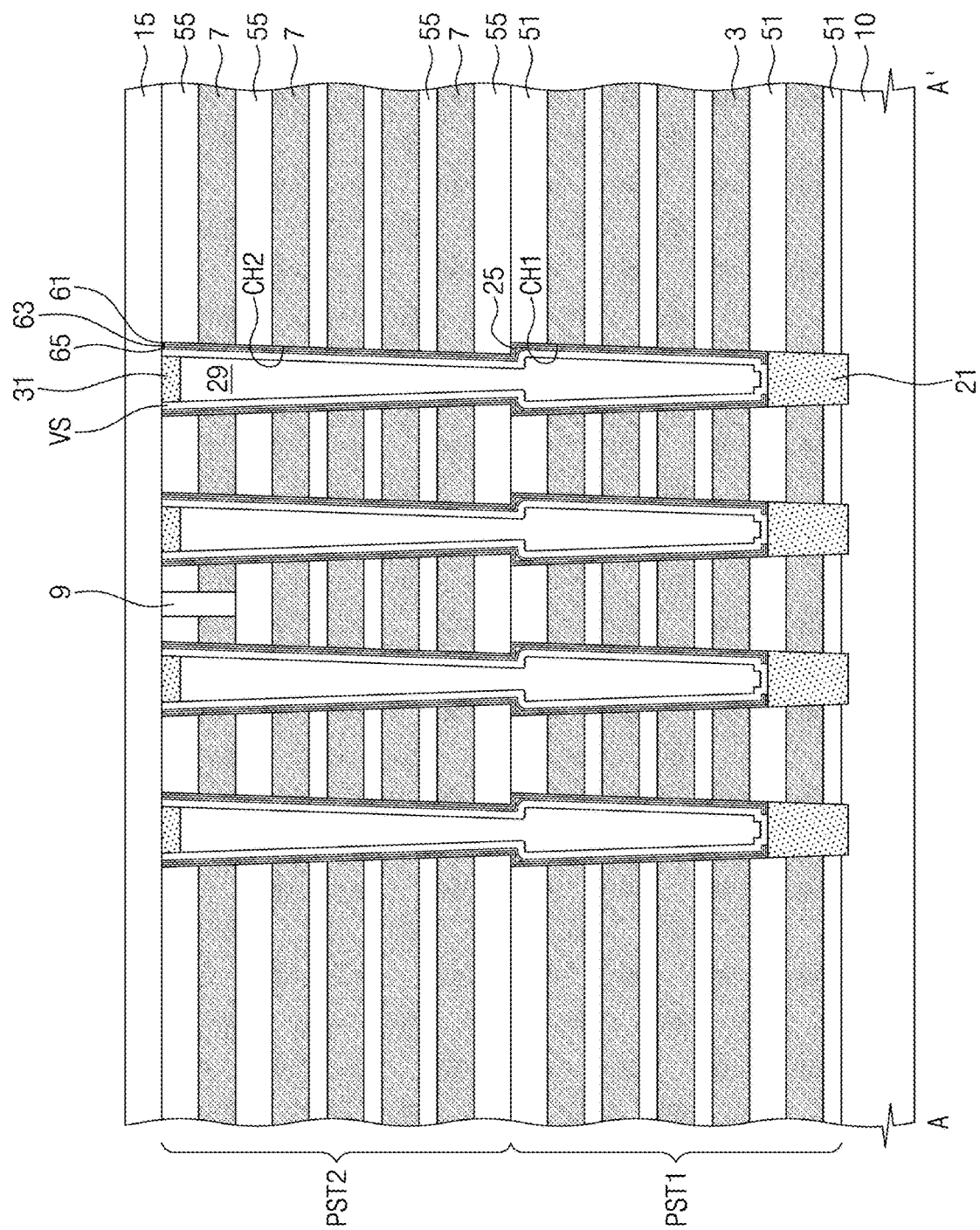
Figure 12B:
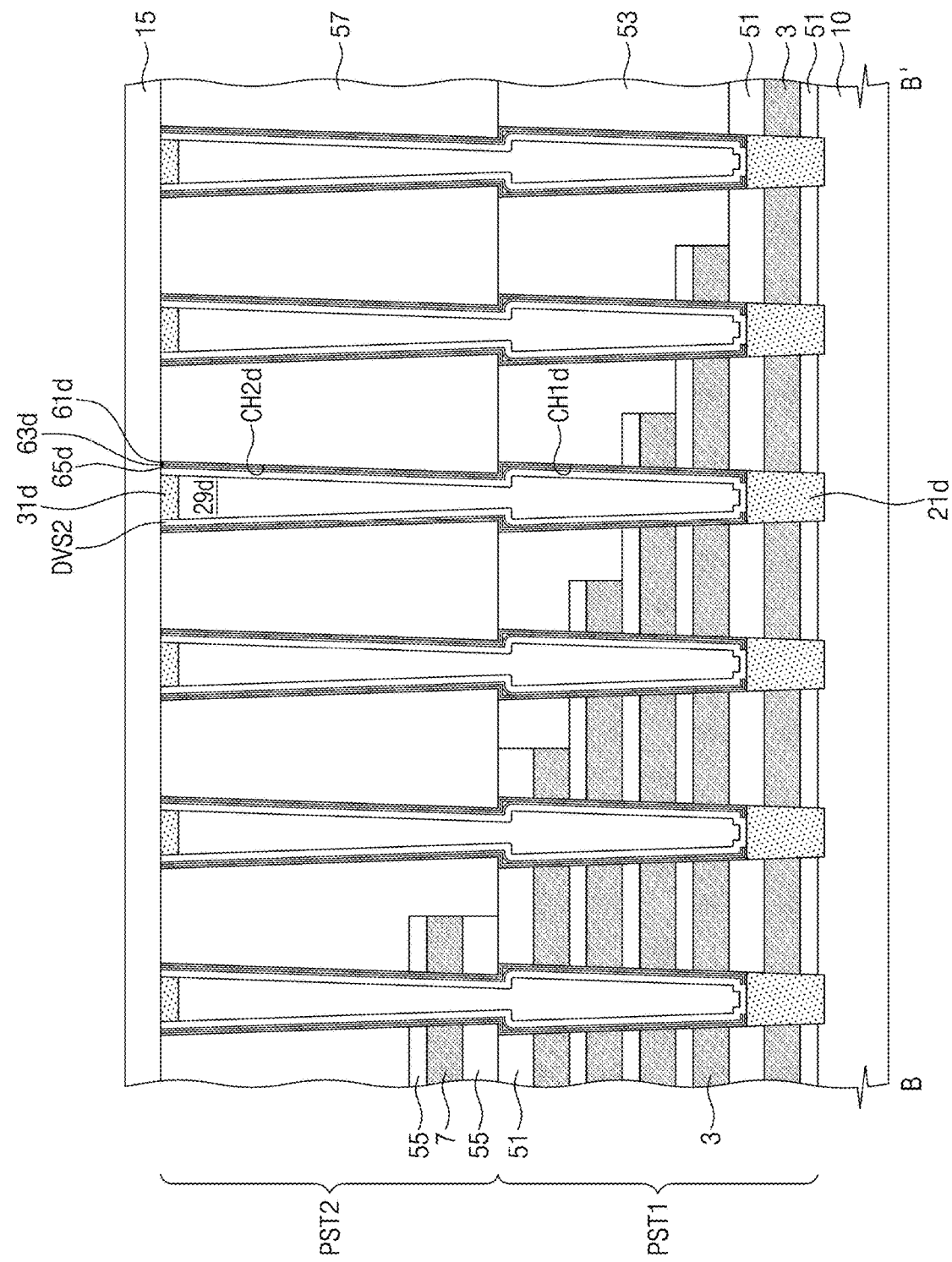

Referring to FIGS. 12A and 12B, a CMP process may be performed to remove the blocking insulating layer 61a, the charge storing layer 63a, the tunnel insulating layer 65a, the vertical semiconductor layer 27, and the insulating gapfill layer 29a from a top surface of the second preliminary stack structure PST2. As a result, the top surface of the second preliminary stack structure PST2 may be exposed, and the blocking insulating pattern 61, the charge storing pattern 63, the tunnel insulating pattern 65, the vertical semiconductor pattern VS, and an insulating filling pattern 29 may be locally formed in the first and second vertical channel holes CH1 and CH2. Similarly, the dummy blocking insulating pattern 61d, the dummy charge storing pattern 63d, the dummy tunnel insulating pattern 65d, the second dummy vertical semiconductor pattern DVS2, and the dummy insulating filling pattern 29d may be formed in the first and second dummy vertical channel holes CH1d and CH2d. At this time, the first dummy vertical semiconductor pattern DVS1 may be formed on the cell array region CAR. The insulating filling pattern 29 and the dummy insulating filling pattern 29d may be partially etched to form recessed regions, and then, the conductive pad 31 and the dummy conductive pad 31d may be formed by filling the recessed regions with a doped poly-silicon layer or a conductive layer. Thereafter, the upper insulating layer 15 may be formed on the second preliminary stack structure PST2.

Figure 13A:
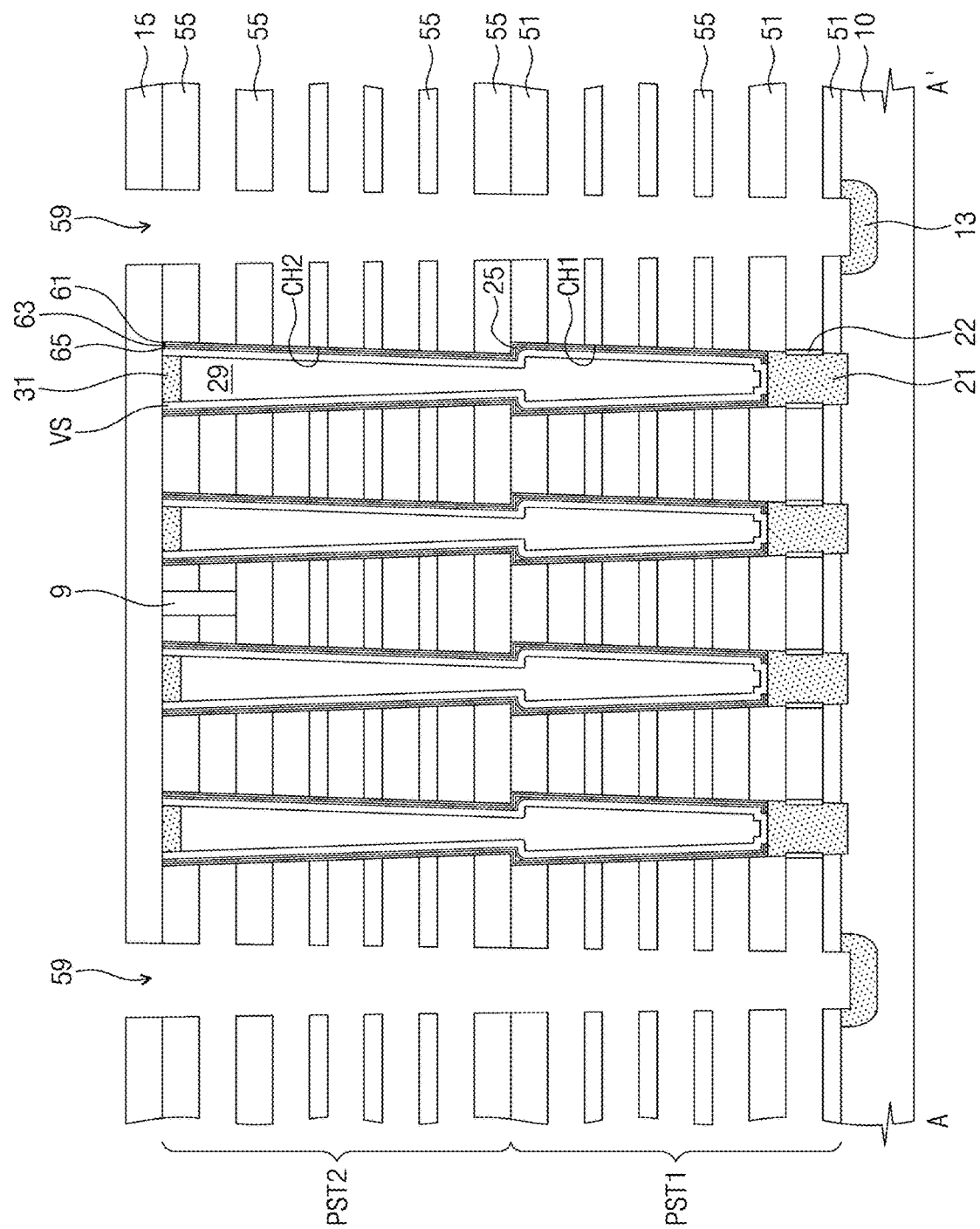
Figure 13B:
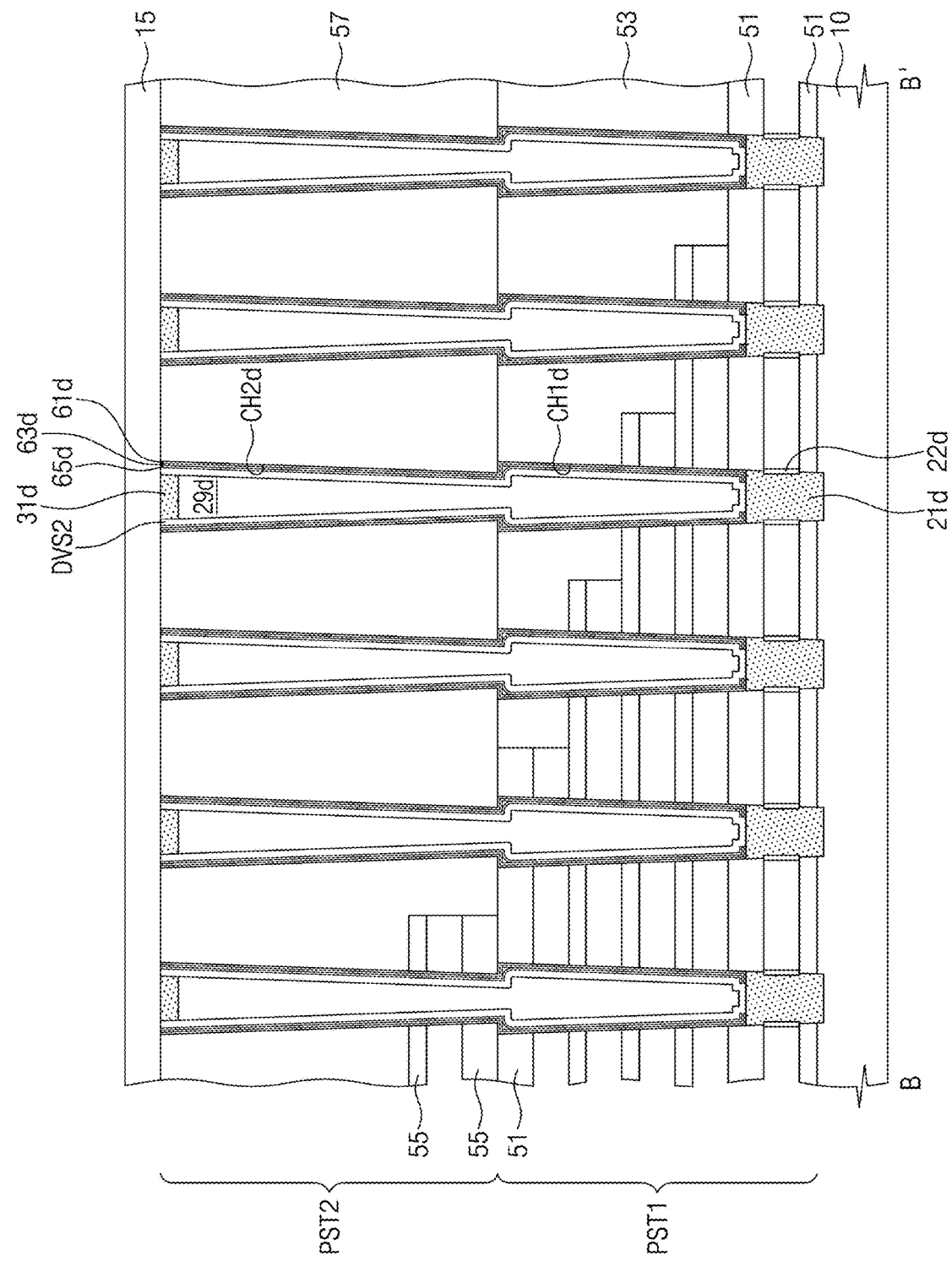

Referring to FIGS. 13A and 13B, the upper insulating layer 15, the second preliminary stack structure PST2, and the first preliminary stack structure PST1 may be sequentially etched to form the source grooves 59 exposing the substrate 10. An ion implantation process may be performed to form the common source region 13 in the substrate 10 exposed by the source grooves 59. The first sacrificial layers 3 and the second sacrificial layers 7 may be removed through the source grooves 59, and as a result, top and bottom surface of the first and second gate interlayered insulating layers 51 and 55 may be exposed. The dummy patterns DVS2, 61d, 63d, 65d, and 29d may prevent the first and second preliminary stack structures PST1 and PST2 on the connection region CNR from being leaned or collapsed. Since the first and second sacrificial layers 3 and 7 are removed, side surfaces of the lower semiconductor pad 21, the dummy lower semiconductor pad 21d, the insulating separation pattern 9, the first interlayered insulating layer 53, and the second interlayered insulating layer 57 may be exposed. A thermal oxidation process may be performed to oxidize at least a portion of the exposed side surfaces of the lower semiconductor pad 21 and the dummy lower semiconductor pad 21d, and as a result, the ground gate insulating layer 22 and the dummy ground gate insulating layer 22d may be formed on the exposed side surfaces of the lower semiconductor pad 21 and the dummy lower semiconductor pad 21d.

Referring back to FIGS. 4A and 4B, a conductive layer may be formed to fill empty regions, from which the first and second sacrificial layers 3 and 7 are removed. Before the formation of the conductive layer, a gate insulating layer (not shown) may be formed to conformally cover the empty regions, from which the first and second sacrificial layers 3 and 7 are removed. The conductive layer in the source grooves 59 may be removed after the formation of the conductive layer, and the insulating spacer 17 may be formed to cover side surfaces of the source grooves 59. Next, the source contact plugs CSPLG may be formed to fill the source grooves 59 provided with the insulating spacer 17.

Figure 14:
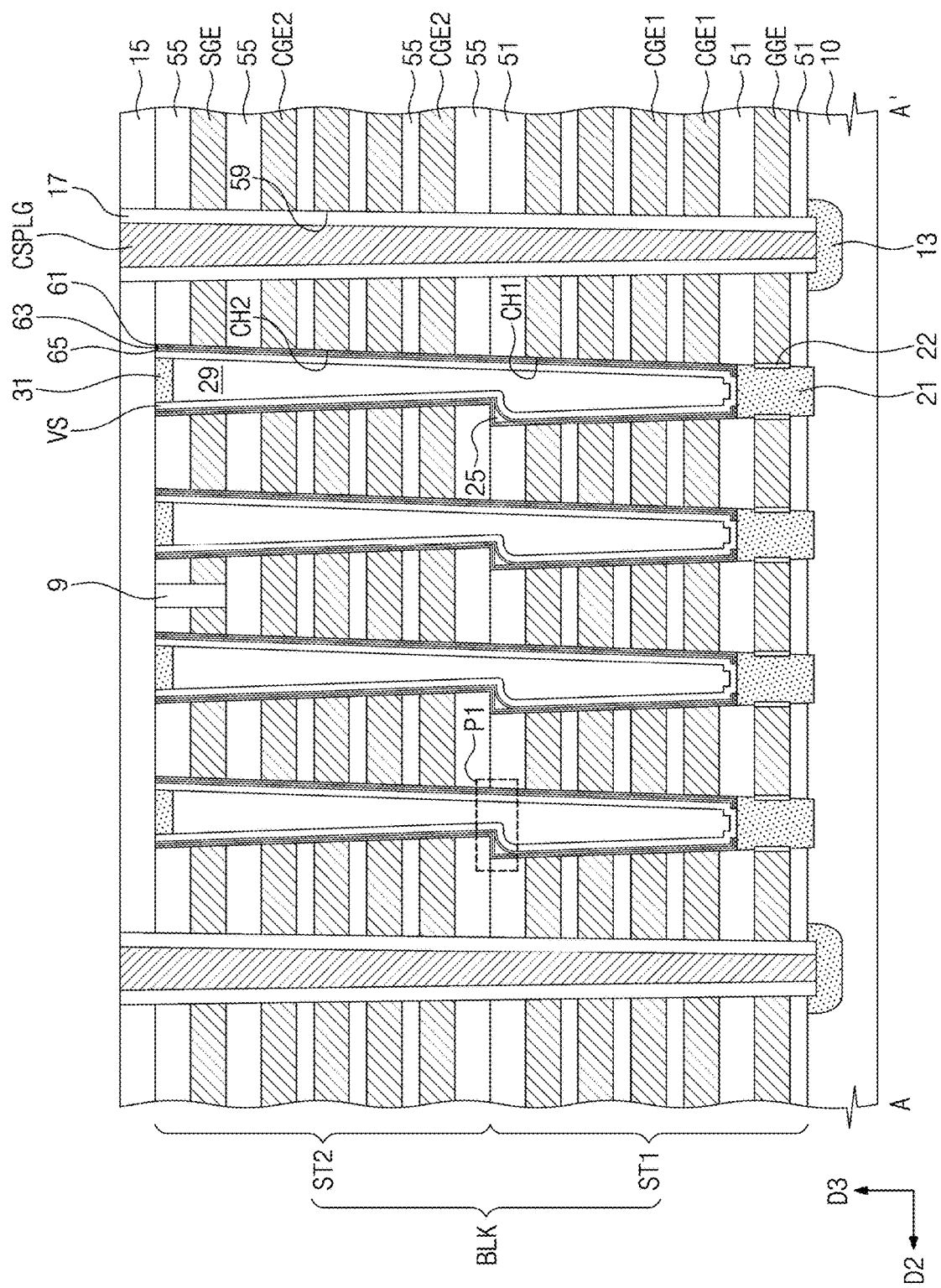
FIG. 14 is a sectional view illustrating a vertical section taken along line A-A' of FIG. 3.
Figure 15:
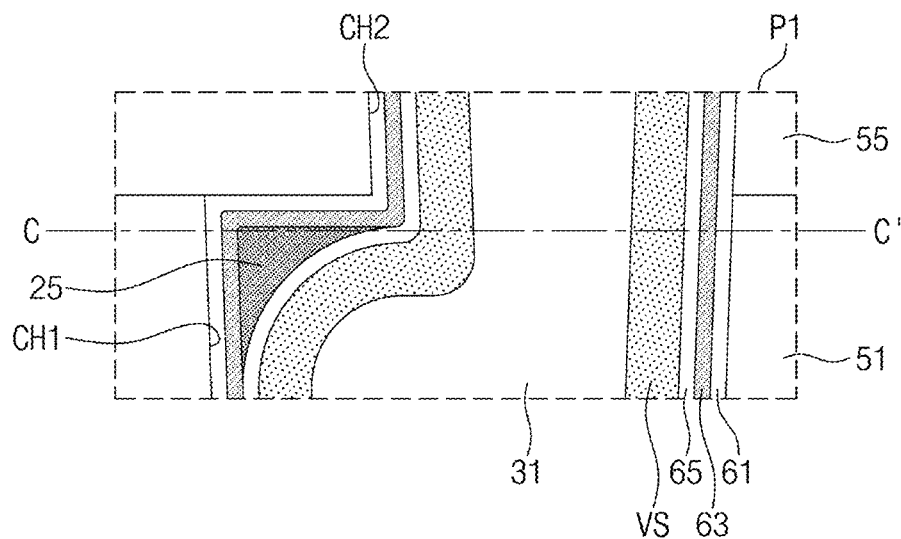
FIGS. 15 and 17 are enlarged sectional views each illustrating a vertical section of a portion 'P1' of FIG. 14.
Figure 16:
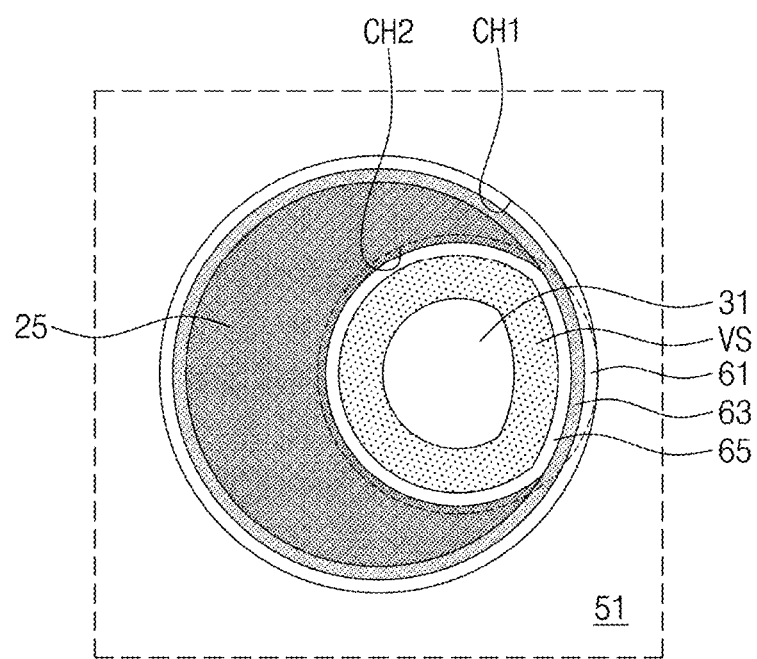
FIG. 16 is a sectional view illustrating a horizontal section taken along line C-C' of FIG. 15.
Figure 17:
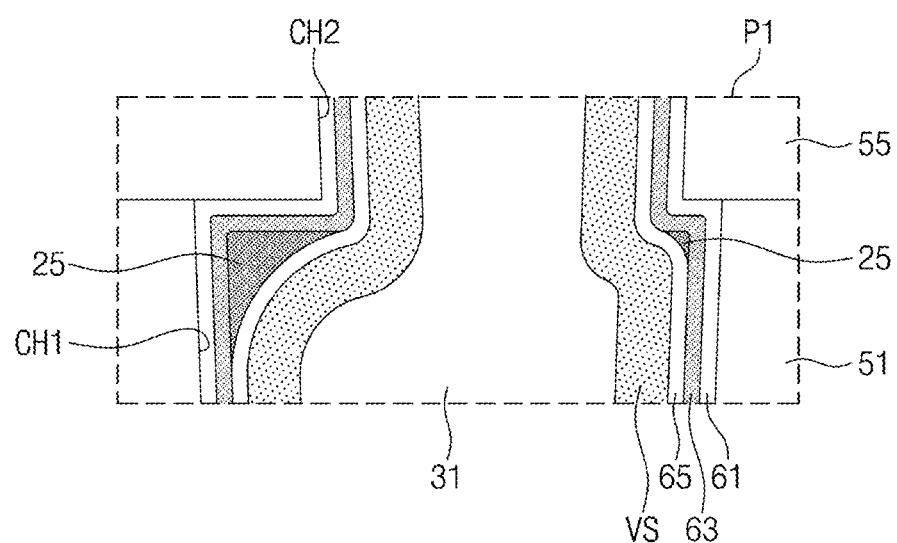

FIG. 14 is a sectional view illustrating a vertical section taken along line A-A' of FIG. 3. FIGS. 15 and 17 are enlarged sectional views each illustrating a vertical section of a portion 'P1' of FIG. 14. FIG. 16 is a sectional view illustrating a horizontal section taken along line C-C' of FIG. 15.

Referring to FIGS. 14 to 17, a center of the second vertical channel hole CH2 may not be aligned to a center of the first vertical channel hole CH1. In severe cases, the inner side surface of the first vertical channel hole CH1 may include a flat portion that is connected to a portion of the inner side surface of the second vertical channel hole CH2, without any bent portion therebetween. By contrast, another portion of the inner side surface of the first vertical channel hole CH1 may be spaced apart from another portion of the inner side surface of the second vertical channel hole CH2, when viewed in a plan view. As shown in the enlarged sectional view of FIG. 15, the buffer pattern 25 may be formed near the bent portion of the inner side surface of the first vertical channel hole CH1 but may not be formed near the flat portion of the inner side surface of the first vertical channel hole CH1. When viewed in a plan view, the buffer pattern 25 may be shaped like an arc or a half moon, as shown in FIG. 16. For example, a width of the buffer pattern 25 may vary along a circumference of a top portion of the first vertical channel hole CH1.

Alternatively, as shown in FIG. 17, the buffer pattern 25 may be formed near all of opposite upper portions of the inner side surface of the first vertical channel hole CH1, but size (e.g., a thickness and a width) of the buffer pattern 25 may vary along the circumference of the top portion of the first vertical channel hole CH1.

When the second vertical channel hole CH2 and the second dummy vertical channel hole CH2d are formed in the step of FIGS. 9A and 9B, they may be slightly misaligned from the first vertical channel hole CH1 and the first dummy vertical channel hole CH1d. In this case, the three-dimensional semiconductor memory device may be formed to have the structure as described with reference to FIGS. 14 to 17.

Figure 18:
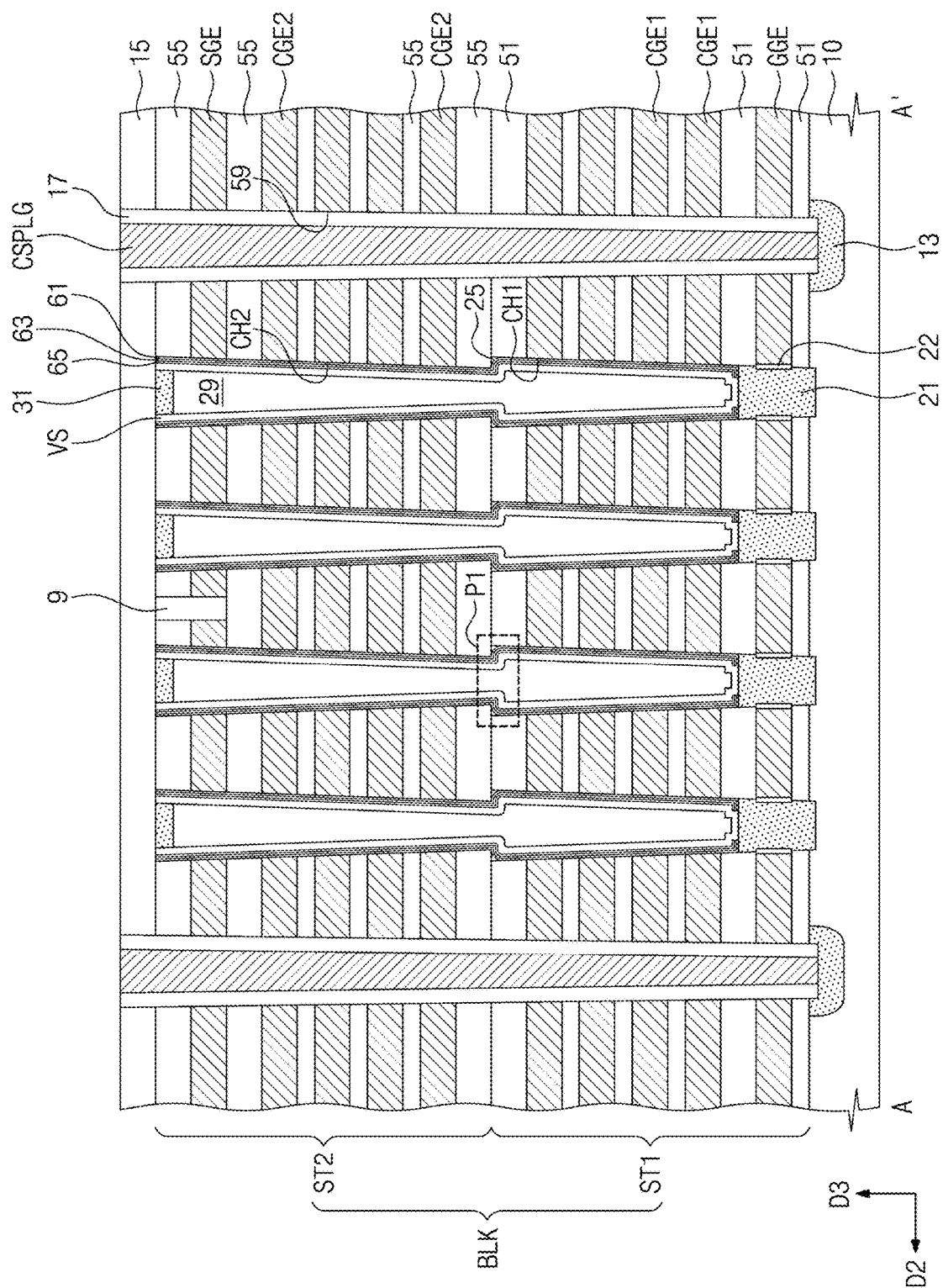
FIG. 18 is a sectional view illustrating a vertical section taken along line A-A' of FIG. 3.
Figure 19:
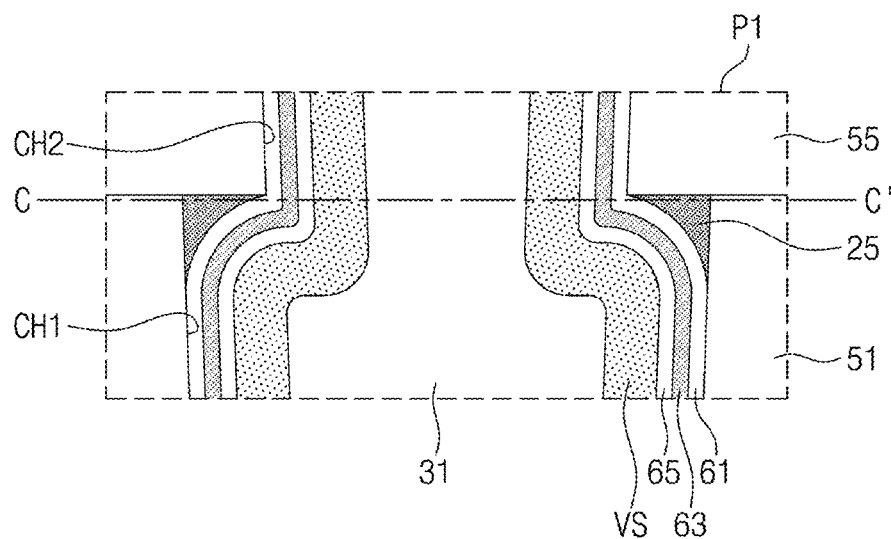
FIG. 19 is an enlarged sectional view illustrating a vertical section of a portion 'P1' of FIG. 18.
Figure 20:
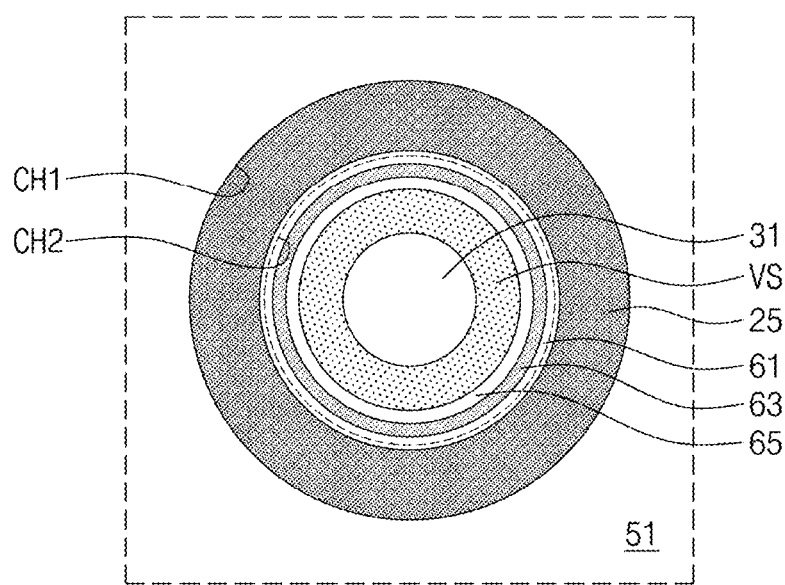
FIG. 20 is a sectional view illustrating a horizontal section taken along line C-C' of FIG. 19.

FIG. 18 is a sectional view illustrating a vertical section taken along line A-A' of FIG. 3. FIG. 19 is an enlarged sectional view illustrating a vertical section of a portion 'P1' of FIG. 18. FIG. 20 is a sectional view illustrating a horizontal section taken along line C-C' of FIG. 19.

Referring to FIGS. 18 to 20, the buffer pattern 25 may not be interposed between the charge storing pattern 63 and the tunnel insulating pattern 65. The buffer pattern 25 may be in contact with the upper portion of the inner side surface of the first vertical channel hole CH1 and the bottom surface of the second gate interlayered insulating layer 55 (i.e., the bottom surface of the second stack structure ST2). The buffer pattern 25 may be formed to fill at least a portion or a considerable portion of a corner region, which is defined by the upper portion of the inner side surface of the first vertical channel hole CH1 and the bottom surface of the second stack structure ST2. The buffer pattern 25 may be in contact with the blocking insulating pattern 61. The blocking insulating pattern 61, the charge storing pattern 63, the tunnel insulating pattern 65 and the vertical semiconductor pattern VS may be conformally and sequentially formed on the buffer pattern 25. Except for these differences, the three-dimensional semiconductor memory device according to the present embodiment may have the same or similar features as that in the previous embodiments.

To fabricate the three-dimensional semiconductor memory device of FIGS. 18 to 20, in the step of FIGS. 10A and 10B, the buffer pattern 25 may be formed in advance before forming the blocking insulating layer 61a and the charge storing layer 63a, and then, subsequent steps may be performed in the same manner as that in the previous embodiments.

Figure 21:
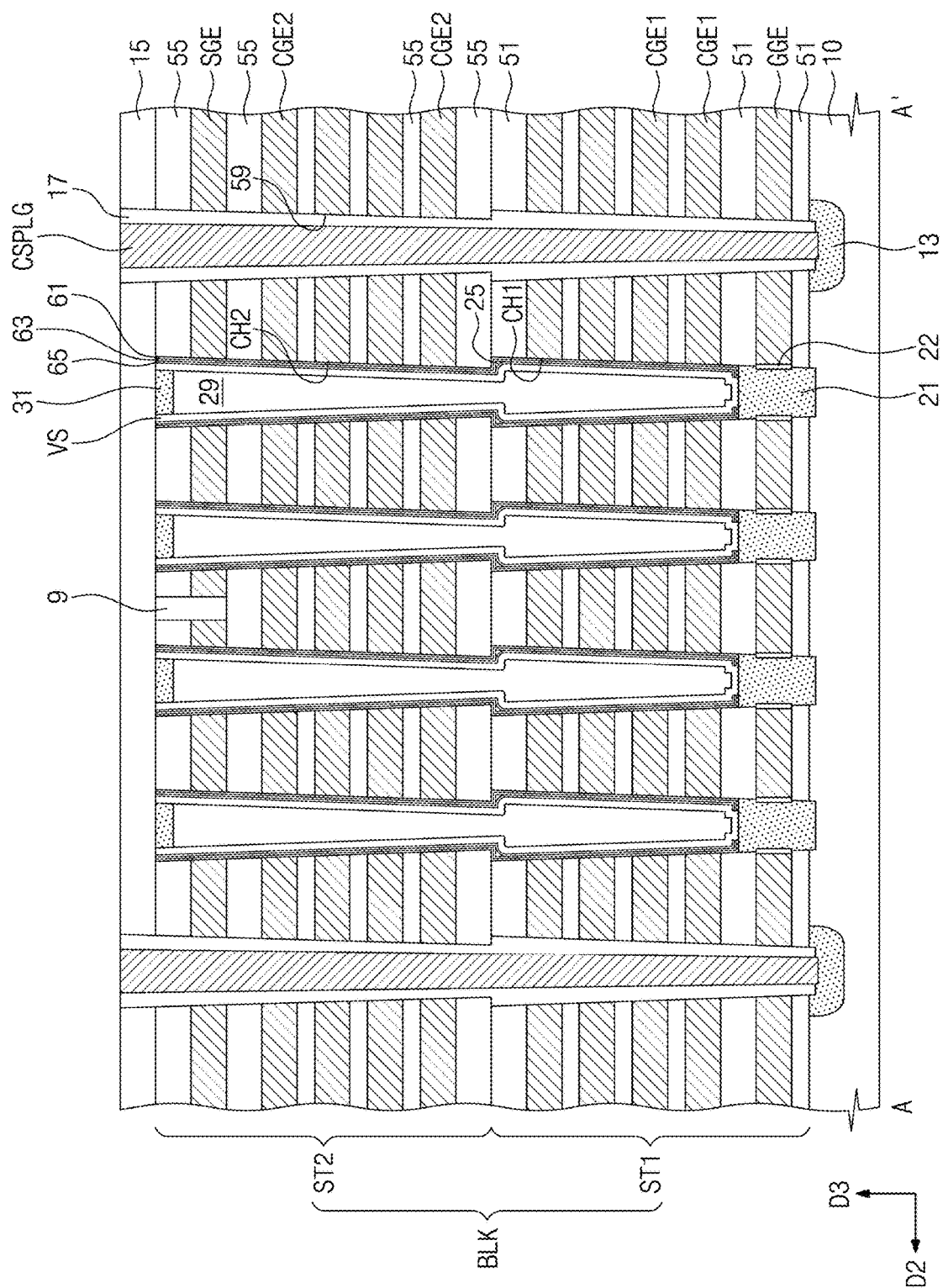
FIG. 21 is a sectional view illustrating a vertical section taken along line A-A' of FIG. 3.

FIG. 21 is a sectional view illustrating a vertical section taken along line A-A' of FIG. 3.

Referring to FIG. 21, the insulating spacer 17 covering the side surface of the source contact plug CSPLG may have a shape different from that of FIG. 4A. An outer side surface of the insulating spacer 17 may have a bent sectional profile, near a border portion between the first stack structure ST1 and the second stack structure ST2. In this case, the source groove 59 may be formed by two etching processes, as in the first and second vertical channel holes CH1 and CH2. Except for these differences, the three-dimensional semiconductor memory device according to the present embodiment may have the same or similar features as that in the previous embodiments.

Figure 22:
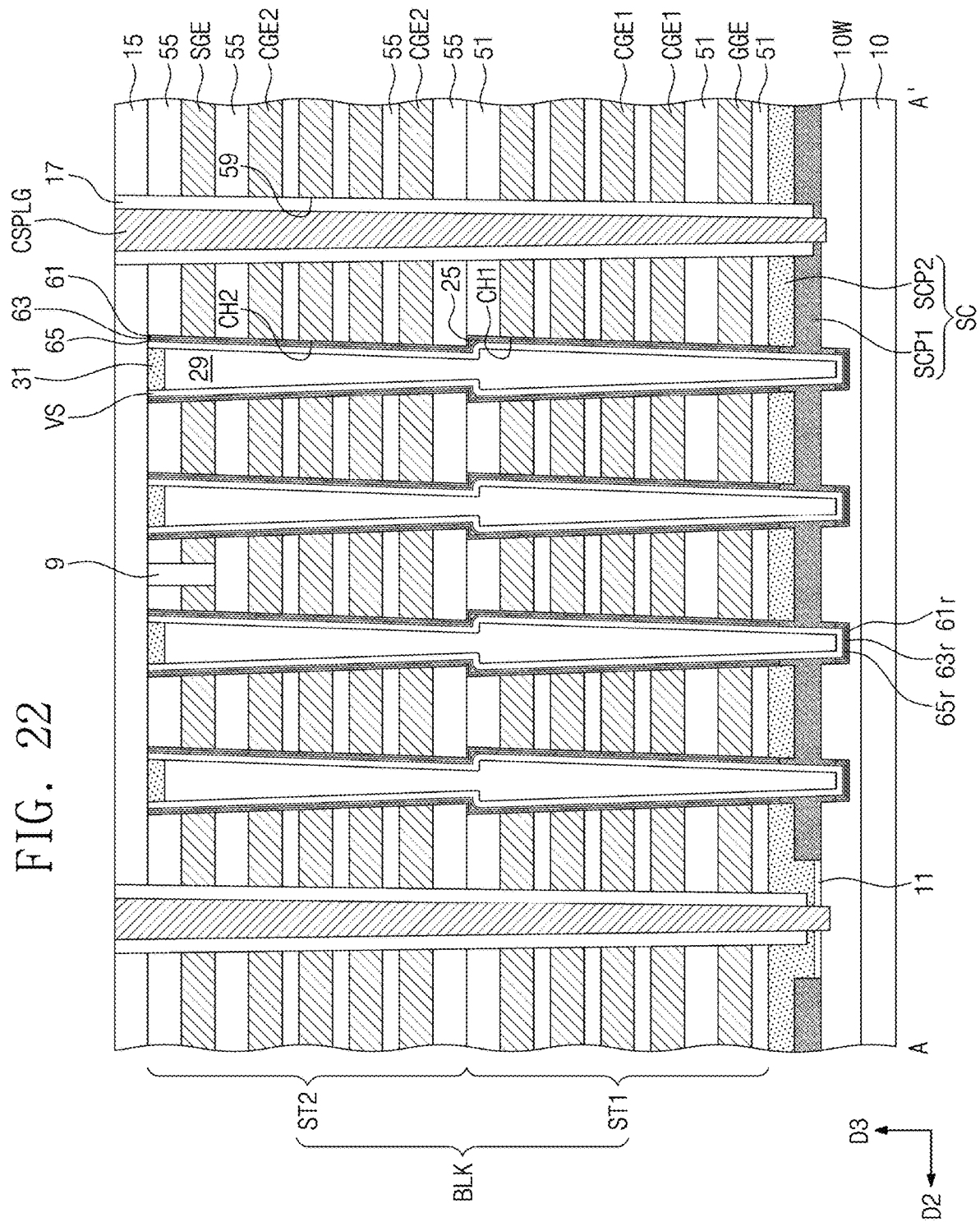
FIG. 22 is a sectional view illustrating a vertical section taken along line A-A' of FIG. 3.

FIG. 22 is a sectional view illustrating a vertical section taken along line A-A' of FIG. 3.

Referring to FIG. 22, the substrate 10 in the present embodiments may be a doped silicon wafer of a first conductivity type. A well impurity region $10w$ may be provided in the substrate 10. The well impurity region $10w$ may be formed to have a second conductivity type, which is different from that of the substrate 10, and may contain dopants (e.g., phosphorus (P) or arsenic (As)). In certain embodiments, the well impurity region $10w$ may be omitted. A source structure SC may be interposed between the first stack structure ST1 and the substrate 10. The source structure SC may include a first source conductive pattern SCP1 and a second source conductive pattern SCP2 thereon. The first and second source conductive patterns SCP1 and SCP2 may be formed of a semiconductor material, which is doped with dopants (e.g., phosphorus (P) or arsenic (As)) to have the second conductivity type. In some embodiments, the first and second source conductive patterns SCP1 and SCP2 may be formed of an n-type doped polysilicon layer, and in this case, a concentration of n-type dopants may be higher in the first source conductive pattern SCP1 than in the second source conductive pattern SCP2.

The first vertical channel hole CH1 may penetrate the first stack structure ST1 and the source structure SC and expose the substrate 10. The lower semiconductor pad 21 may not be provided below the first vertical channel hole CH1. The vertical semiconductor pattern VS may be extended to the bottom of the first vertical channel hole CH1. The blocking insulating pattern 61, the charge storing pattern 63, and the tunnel insulating pattern 65 may be spaced apart from the bottom of the first vertical channel hole CH1. A remaining blocking insulating pattern 61r, a remaining charge storing pattern 63r, and a remaining tunnel insulating pattern 65r, which are sequentially stacked, may be located on the bottom of the first vertical channel hole CH1. The first source conductive pattern SCP1 may be in contact with the vertical semiconductor pattern VS. A portion of the first source conductive pattern SCP1 may be extended between the vertical semiconductor pattern VS and the second source conductive pattern SCP2 and between the vertical semiconductor pattern VS and the well impurity region $10w$ of the substrate 10.

In a region adjacent to the source contact plug CSPLG, the first source conductive pattern SCP1 may be spaced apart from the insulating spacer 17. A side surface of the first source conductive pattern SCP1 may be covered with the second source conductive pattern SCP2. The second source conductive pattern SCP2 may be interposed between a bottom surface of the insulating spacer 17 and the substrate 10. A lower insulating layer 11 may be interposed between the second source conductive pattern SCP2 and the substrate 10. The source contact plug CSPLG may include a lower portion, which is downward extended beyond the bottom of the insulating spacer 17. For example, the lower portion of the source contact plug CSPLG may penetrate the second source conductive pattern SCP2 and the lower insulating layer 11 and may be in contact with the well impurity region $10w$ of the substrate 10. Except for these differences, the three-dimensional semiconductor memory device according to the present embodiment may have the same or similar features as that in the previous embodiments.

According to some example embodiments of the inventive concept, a three-dimensional semiconductor memory device may include a buffer pattern filling at least a portion of a corner region, which is defined by an upper portion of an inner side surface of a first vertical channel hole and a bottom surface of a second gate interlayered insulating layer. Thus, it may be possible to prevent a vertical semiconductor pattern from being cut or from having a non-uniform thickness, and as a result, reliability of the three-dimensional semiconductor memory device may be improved.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a lower stack structure having a lower vertical channel hole having a first lower inner side surface and a second lower inner side surface, the first lower inner side surface being opposite to the second lower inner side surface,
   an upper stack structure on the lower stack structure, the upper stack structure having an upper vertical channel hole overlapping the lower vertical channel hole, the upper vertical channel hole having a first upper inner side surface and a second upper inner side surface, a portion of a bottom surface of the upper stack structure being exposed by the lower vertical channel hole, the first upper inner side surface being opposite to the second upper inner side surface, a top width of the lower vertical channel hole being greater than a bottom width of the upper vertical channel hole,
   a first corner region on a top of the first lower inner side surface under the upper stack structure,
   a second corner region on a top of the second lower inner side surface under the upper stack structure,
   a first blocking insulating pattern on the first lower inner side surface, the first corner region and the first upper inner side surface;
   a second blocking insulating pattern on the second lower inner side surface, the second corner region and the second upper inner side surface;
   a first charge storing pattern on the first blocking insulating pattern;
   a second charge storing pattern on the second blocking insulating pattern;
   a first tunnel insulating pattern on the first charge storing pattern;
   a second tunnel insulating pattern on the second charge storing pattern;
   a first vertical semiconductor pattern on the first tunnel insulating pattern; and
   a second vertical semiconductor pattern on the second tunnel insulating pattern,
   wherein the first vertical semiconductor pattern has a first curved portion on the first corner region and the second vertical semiconductor pattern has a second curved portion on the second corner region, a first length of the first curved portion being greater than a second length of the second curved portion, the first curved portion and the second curved portion beginning from a same vertical position.

2. The three-dimensional semiconductor memory device of claim 1, wherein the first curved portion has a first curved surface of a first curvature on the first corner region and the second curved portion has a second curved surface of a second curvature on the second corner region, the first curvature being lower than the second curvature.

3. The three-dimensional semiconductor memory device of claim 1,
   wherein the first vertical semiconductor pattern has a first portion in the lower stack structure and a second portion penetrating the upper stack structure,
   wherein the second vertical semiconductor pattern has a third portion in the lower stack structure and a fourth portion penetrating the upper stack structure,
   wherein the first curved portion connects the first portion and the second portion,
   wherein the second curved portion connects the third portion and the fourth portion.

4. The three-dimensional semiconductor memory device of claim 1,
   wherein the first charge storing pattern is spaced apart from the first tunnel insulating pattern on the first corner region.

5. The three-dimensional semiconductor memory device of claim 4,
   wherein the second charge storing pattern is in contact with the second tunnel insulating pattern on the first corner region.

6. The three-dimensional semiconductor memory device of claim 1, wherein a first distance between the first blocking insulating pattern and the first vertical semiconductor pattern on the first corner region is different from a second distance between the second blocking insulating pattern and the second vertical semiconductor pattern on the second corner region.

7. The three-dimensional semiconductor memory device of claim 6,
   wherein the first charge storing pattern is spaced apart from the first tunnel insulating pattern on the first corner region by a third distance,
   wherein the second charge storing pattern is spaced apart from the second tunnel insulating pattern on the first corner region by a fourth distance, and
   wherein the third distance is different from the fourth distance.

8. The three-dimensional semiconductor memory device of claim 1, further comprising:
   an insulating gapfill layer filling the lower vertical channel hole and the upper vertical channel hole and contacting the first vertical semiconductor pattern and the second vertical semiconductor pattern,
   wherein the insulating gapfill layer has a first curved surface contacting the first vertical semiconductor pattern on the first corner region and a second curved surface contacting the second vertical semiconductor pattern on the second corner region,
   wherein the first curved surface has a first curvature and the second curved surface has a second curvature, the first curvature being lower than the second curvature.

9. A three-dimensional semiconductor memory device, comprising:
   a lower stack structure having a lower vertical channel hole having a first lower inner side surface and a second lower inner side surface, the first lower inner side surface being opposite to the second lower inner side surface,
   an upper stack structure on the lower stack structure, the upper stack structure having an upper vertical channel hole overlapping the lower vertical channel hole, the upper vertical channel hole having a first upper inner side surface and a second upper inner side surface, a portion of a bottom surface of the upper stack structure being exposed by the lower vertical channel hole, the first upper inner side surface being opposite to the second upper inner side surface, a top width of the lower vertical channel hole being greater than a bottom width of the upper vertical channel hole,
a first corner region on a top of the first lower inner side surface under the upper stack structure,
a second corner region on a top of the second lower inner side surface under the upper stack structure,
a first blocking insulating pattern on the first lower inner side surface, the first corner region and the first upper inner side surface;
a second blocking insulating pattern on the second lower inner side surface, the second corner region, and the second upper inner side surface;
a first charge storing pattern on the first blocking insulating pattern;
a second charge storing pattern on the second blocking insulating pattern;
a first tunnel insulating pattern on the first charge storing pattern;
a second tunnel insulating pattern on the second charge storing pattern;
a first vertical semiconductor pattern on the first tunnel insulating pattern; and
a second vertical semiconductor pattern on the second tunnel insulating pattern,
wherein the first vertical semiconductor pattern has a first curved surface on the first corner region and the second vertical semiconductor pattern has a second curved surface on the second corner region, a first length of the first curved surface being greater than a second length of the second curved surface, the first curved surface and the second curved surface beginning from a same vertical position.

10. The three-dimensional semiconductor memory device of claim 9, wherein a first distance between the first blocking insulating pattern and the first vertical semiconductor pattern on the first corner region is greater than a second distance between the second blocking insulating pattern and the second vertical semiconductor pattern on the second corner region.

11. The three-dimensional semiconductor memory device of claim 10, wherein the first charge storing pattern is spaced apart from the first tunnel insulating pattern on the first corner region.

12. The three-dimensional semiconductor memory device of claim 11, wherein the second charge storing pattern is in contact with the second tunnel insulating pattern on the first corner region.

13. The three-dimensional semiconductor memory device of claim 10,
wherein the first charge storing pattern is spaced apart from the first tunnel insulating pattern on the first corner region by a third distance,
wherein the second charge storing pattern is spaced apart from the second tunnel insulating pattern on the first corner region by a fourth distance, and
wherein the third distance is greater than the fourth distance.

14. The three-dimensional semiconductor memory device of claim 9, further comprising:
an insulating gapfill layer filling the lower vertical channel hole and the upper vertical channel hole and contacting the first vertical semiconductor pattern and the second vertical semiconductor pattern,
wherein the insulating gapfill layer has a third curved surface contacting the first vertical semiconductor pattern on the first corner region and a fourth curved surface contacting the second vertical semiconductor pattern on the second corner region,
wherein the third curved surface has a first curvature and the fourth curved surface has a second curvature, the first curvature being lower than the second curvature.

15. The three-dimensional semiconductor memory device of claim 9,
wherein the first vertical semiconductor pattern has a first surface in the lower stack structure and a second surface penetrating the upper stack structure,
wherein the second vertical semiconductor pattern has a third surface in the lower stack structure and a fourth surface penetrating the upper stack structure,
wherein the first curved surface connects the first surface and the second surface,
wherein the second curved surface connects the third surface and the fourth surface.

16. A three-dimensional semiconductor memory device, comprising:
a lower stack structure having a lower vertical channel hole having a first lower inner side surface and a second lower inner side surface, the first lower inner side surface being opposite to the second lower inner side surface,
an upper stack structure on the lower stack structure, the upper stack structure having an upper vertical channel hole overlapping the lower vertical channel hole, the upper vertical channel hole having a first upper inner side surface and a second upper inner side surface, a portion of a bottom surface of the upper stack structure being exposed by the lower vertical channel hole, the first upper inner side surface being opposite to the second upper inner side surface, a top width of the lower vertical channel hole being greater than a bottom width of the upper vertical channel hole,
a first corner region on a top of the first lower inner side surface under the upper stack structure,
a second corner region on a top of the second lower inner side surface under the upper stack structure,
a first blocking insulating pattern on the first lower inner side surface, the first corner region and the first upper inner side surface;
a second blocking insulating pattern on the second lower inner side surface, the second corner region and the second upper inner side surface;
a first charge storing pattern on the first blocking insulating pattern;
a second charge storing pattern on the second blocking insulating pattern;
a first tunnel insulating pattern on the first charge storing pattern;
a second tunnel insulating pattern on the second charge storing pattern;
a first vertical semiconductor pattern on the first tunnel insulating pattern;
a second vertical semiconductor pattern on the second tunnel insulating pattern; and
an insulating gapfill layer filling the lower vertical channel hole and the upper vertical channel hole and contacting the first vertical semiconductor pattern and the second vertical semiconductor pattern,
wherein the insulating gapfill layer has a first curved surface contacting the first vertical semiconductor pattern on the first corner region and a second curved surface contacting the second vertical semiconductor pattern on the second corner region, a first length of the first curved surface being greater than a second length of the second curved surface, the first curved surface and the second curved surface beginning from a same vertical position.

17. The three-dimensional semiconductor memory device of claim 16,
wherein a first distance between the first blocking insulating pattern and the first vertical semiconductor pattern on the first corner region is greater than a second distance between the second blocking insulating pattern and the second vertical semiconductor pattern on the second corner region.

18. The three-dimensional semiconductor memory device of claim 17,
wherein the first charge storing pattern is spaced apart from the first tunnel insulating pattern on the first corner region.

19. The three-dimensional semiconductor memory device of claim 18,
wherein the second charge storing pattern is in contact with the second tunnel insulating pattern on the first corner region.

20. The three-dimensional semiconductor memory device of claim 16,
wherein the insulating gapfill layer has a first surface in the lower stack structure, a second surface in the lower stack structure, a third surface penetrating the upper stack structure, and a fourth surface penetrating the upper stack structure,
wherein the first curved surface connects the first surface and the third surface,
wherein the second curved surface connects the second surface and the fourth surface.

* * * * *